(12) United States Patent
Patil et al.

(10) Patent No.: US 11,545,439 B2
(45) Date of Patent: Jan. 3, 2023

(54) PACKAGE COMPRISING AN INTEGRATED DEVICE COUPLED TO A SUBSTRATE THROUGH A CAVITY

(71) Applicant: QUALCOMM Incorporated, San Diego, CA (US)

(72) Inventors: Aniket Patil, San Diego, CA (US); Hong Bok We, San Diego, CA (US); Kuiwon Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 126 days.

(21) Appl. No.: 17/017,418

(22) Filed: Sep. 10, 2020

(65) Prior Publication Data

US 2022/0077069 A1   Mar. 10, 2022

(51) Int. Cl.
*H01L 23/538* (2006.01)
*H01L 23/31* (2006.01)
(Continued)

(52) U.S. Cl.
CPC .......... *H01L 23/5385* (2013.01); *H01L 23/13* (2013.01); *H01L 23/3128* (2013.01); *H01L 23/49833* (2013.01); *H01L 23/5383* (2013.01); *H01L 23/5386* (2013.01); *H01L 25/162* (2013.01); *H01L 25/165* (2013.01); *H01L 25/50* (2013.01); *H01L 23/49816* (2013.01); *H01L 24/13* (2013.01); *H01L 24/16* (2013.01); *H01L 24/81* (2013.01)

(58) Field of Classification Search
CPC ............. H01L 23/5385; H01L 23/3128; H01L 23/5383; H01L 23/5386; H01L 25/162; H01L 25/50; H01L 23/49816; H01L 23/50; H01L 2224/16227; H01L 2924/15153; H01L 2924/15311; H01L 2924/19105; H01L 23/49833; H01L 23/13
See application file for complete search history.

(56) References Cited

U.S. PATENT DOCUMENTS 7,977,780 B2   7/2011   Tay et al.
8,686,558 B2   4/2014   Zhao et al.
(Continued)

OTHER PUBLICATIONS

International Search Report and Written Opinion—PCT/US2021/045409—ISA/EPO—dated Dec. 1, 2021.

*Primary Examiner* — Ahmed N Sefer
(74) *Attorney, Agent, or Firm* — Loza & Loza, LLP

(57) ABSTRACT

A package that includes a substrate and an integrated device. The substrate includes a core portion, a first substrate portion and a second substrate portion. The core portion includes a core layer and core interconnects. The first substrate portion is coupled to the core portion. The first substrate portion includes at least one first dielectric layer coupled to the core layer, and a first plurality of interconnects located in the at least one first dielectric layer. The second substrate portion is coupled to the core portion. The second substrate includes at least one second dielectric layer coupled to the core layer, and a second plurality of interconnects located in the at least one second dielectric layer. The core portion and the second substrate portion include a cavity. The integrated device is coupled to the first substrate portion through the cavity of the second substrate portion and the core portion.

30 Claims, 16 Drawing Sheets

PROFILE VIEW

(51) Int. Cl.
*H01L 25/16* (2006.01)
*H01L 25/00* (2006.01)
*H01L 23/13* (2006.01)
*H01L 23/498* (2006.01)
*H01L 23/00* (2006.01)

(56) References Cited

U.S. PATENT DOCUMENTS

| | | |
|---|---|---|
| 8,823,144 B2 | 9/2014 | Khan et al. |
| 9,607,967 B1 | 3/2017 | Shih |
| 10,629,469 B2 | 4/2020 | Konchady et al. |
| 2012/0300425 A1* | 11/2012 | Nakashima ............ H01L 24/19 |
| | | 361/761 |
| 2013/0249101 A1 | 9/2013 | Lin et al. |
| 2014/0048906 A1 | 2/2014 | Shim et al. |
| 2015/0228580 A1 | 8/2015 | Chen et al. |
| 2015/0235990 A1 | 8/2015 | Cheng et al. |
| 2019/0237382 A1* | 8/2019 | Kim ..................... H01L 24/03 |
| 2019/0287872 A1 | 9/2019 | Goh et al. |
| 2020/0058592 A1* | 2/2020 | Kim ..................... A61N 1/375 |
| 2020/0135642 A1* | 4/2020 | Lee ..................... H01L 24/19 |
| 2020/0161203 A1* | 5/2020 | Kim ................. H01L 23/49816 |
| 2020/0163223 A1* | 5/2020 | Mok .................. H01L 23/5389 |
| 2020/0328160 A1* | 10/2020 | Kim ..................... H01L 24/09 |
| 2020/0350254 A1* | 11/2020 | Huang .................. H01L 21/52 |
| 2020/0411461 A1* | 12/2020 | Lee ................. H01L 23/49531 |
| 2021/0125882 A1* | 4/2021 | Oh ..................... H01L 21/565 |
| 2021/0125961 A1* | 4/2021 | Tsai .................... H01L 21/52 |

\* cited by examiner

PROFILE VIEW

PACKAGE COMPRISING AN INTEGRATED DEVICE COUPLED TO A SUBSTRATE THROUGH A CAVITY

FIELD

Various features relate to packages and substrates, but more specifically to a package that includes an integrated device coupled to a substrate.

BACKGROUND

FIG. 1 illustrates a package 100 that includes a substrate 102, an integrated device 103, an integrated device 104 and an integrated device 106. The substrate 102 includes at least one dielectric layer 120, a plurality of interconnects 122 and a plurality of solder interconnects 124. A plurality of solder interconnects 144 is coupled to a first surface of the substrate 102 and the integrated device 104. A plurality of solder interconnects 164 is coupled to the first surface of the substrate 102 and the integrated device 106. A plurality of solder interconnects 134 is coupled to a second surface of the substrate 102 and the integrated device 103. The package 100 is coupled to a board 105 through the plurality of solder interconnects 124 such that the integrated device 103 is located in a cavity 150 of the board 105. There is an ongoing need to provide robust, reliable package with small form factors.

SUMMARY

Various features relate to packages and substrates, but more specifically to a package that includes an integrated device coupled to a substrate.

One example provides a package that includes a substrate and an integrated device. The substrate includes a core portion, a first substrate portion and a second substrate portion. The core portion includes a first surface, a second surface, a core layer, and a plurality of core interconnects located in the core layer. The first substrate portion is coupled to the first surface of the core portion. The first substrate portion includes at least one first dielectric layer coupled to the core layer and a first plurality of interconnects located in the at least one first dielectric layer. The first plurality of interconnects is coupled to the plurality of core interconnects. The second substrate portion is coupled to the second surface of the core portion. The second substrate portion includes at least one second dielectric layer coupled to the core layer, and a second plurality of interconnects located in the at least one second dielectric layer. The second plurality of interconnects is coupled to the plurality of core interconnects. The core portion and the second substrate portion include a cavity. The integrated device is coupled to the first substrate portion through the cavity of the second substrate portion and the core portion.

Another example provides a package that includes a substrate and an integrated device. The substrate includes a first substrate portion and a second substrate portion. The first substrate portion includes at least one first dielectric layer and a first plurality of interconnects located in the at least one first dielectric layer. The second substrate portion is coupled to the first substrate portion. The second substrate portion includes at least one second dielectric layer and a second plurality of interconnects located in the at least one second dielectric layer. The second plurality of interconnects is coupled to the first plurality of interconnects. The second substrate portion includes a cavity that extends through the at least one second dielectric layer. The first substrate portion has a length that is less than a length of the second substrate portion. The length of the second substrate portion includes a length of the cavity in the second substrate portion. The integrated device is coupled to the first substrate portion through the cavity of the second substrate portion.

Another example provides a method for fabricating a package. The method provides a substrate. The substrate includes a core portion, a first substrate portion and a second substrate portion. The core portion includes a first surface and a second surface, a core layer, and a plurality of core interconnects located in the core layer. The first substrate portion is coupled to the first surface of the core portion. The first substrate portion includes at least one first dielectric layer coupled to the core layer, and a first plurality of interconnects located in the at least one first dielectric layer. The first plurality of interconnects is coupled to the plurality of core interconnects. The second substrate portion is coupled to the second surface of the core portion. The second substrate portion includes at least one second dielectric layer coupled to the core layer, and a second plurality of interconnects located in the at least one second dielectric layer. The second plurality of interconnects is coupled to the plurality of core interconnects. The method couples a first device to a first surface of the first substrate portion. The method couples a second device to a first surface of the second substrate portion. The method forms a cavity in the second substrate portion and the core portion. The method couples an integrated device to the first substrate portion through the cavity of the second substrate portion and the core portion.

Another example provides a method for fabricating a package. The method provides a substrate. The substrate includes a first substrate portion and a second substrate portion coupled to the first substrate portion. The first substrate portion includes at least one first dielectric layer, and a first plurality of interconnects located in the at least one first dielectric layer. The second substrate portion includes at least one second dielectric layer, and a second plurality of interconnects located in the at least one second dielectric layer. The second plurality of interconnects is coupled to the first plurality of interconnects. The first substrate portion has a length that is less than a length of the second substrate portion. The method couples a first device to a first surface of the first substrate portion. The method couples a second device to a first surface of the second substrate portion. The method forms a cavity in the second substrate portion. The cavity extends through the at least one second dielectric layer. The length of the second substrate portion includes a length of the cavity in the second substrate portion. The method couples an integrated device to the first substrate portion through the cavity of the second substrate portion.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device. The substrate includes a core portion, a first substrate portion and a second substrate portion. The core portion includes a first surface, a second surface, a core layer, and a plurality of core interconnects located in the core layer. The first substrate portion is coupled to the first surface of the core portion. The first substrate portion includes at least one first dielectric layer coupled to the core layer and a first plurality of interconnects located in the at least one first dielectric layer. The first plurality of interconnects is coupled to the plurality of core interconnects. The second substrate portion is coupled to the second surface of the core portion. The second substrate portion includes at least one second dielectric layer coupled to the core layer, and a second plurality of interconnects located in the at least one second dielectric layer. The second plurality of interconnects is coupled to the plurality of core interconnects. The core portion and the second substrate portion include a cavity. The cavity is an opening in the core portion and the second substrate portion. The integrated device is coupled to the first substrate portion through the cavity of the second substrate portion and the core portion. The package may be coupled to a board (e.g., printed circuit board). The design and configuration of the package is such that the board does not need to have a cavity. This results in an overall assembly that is mechanically and structurally strong, while still maintaining a relatively low thickness, which enables packages with small form factors that can be implemented in small devices (e.g., electronic devices).

Exemplary Packages that Include a Step-Shaped Substrate

Figure 1:
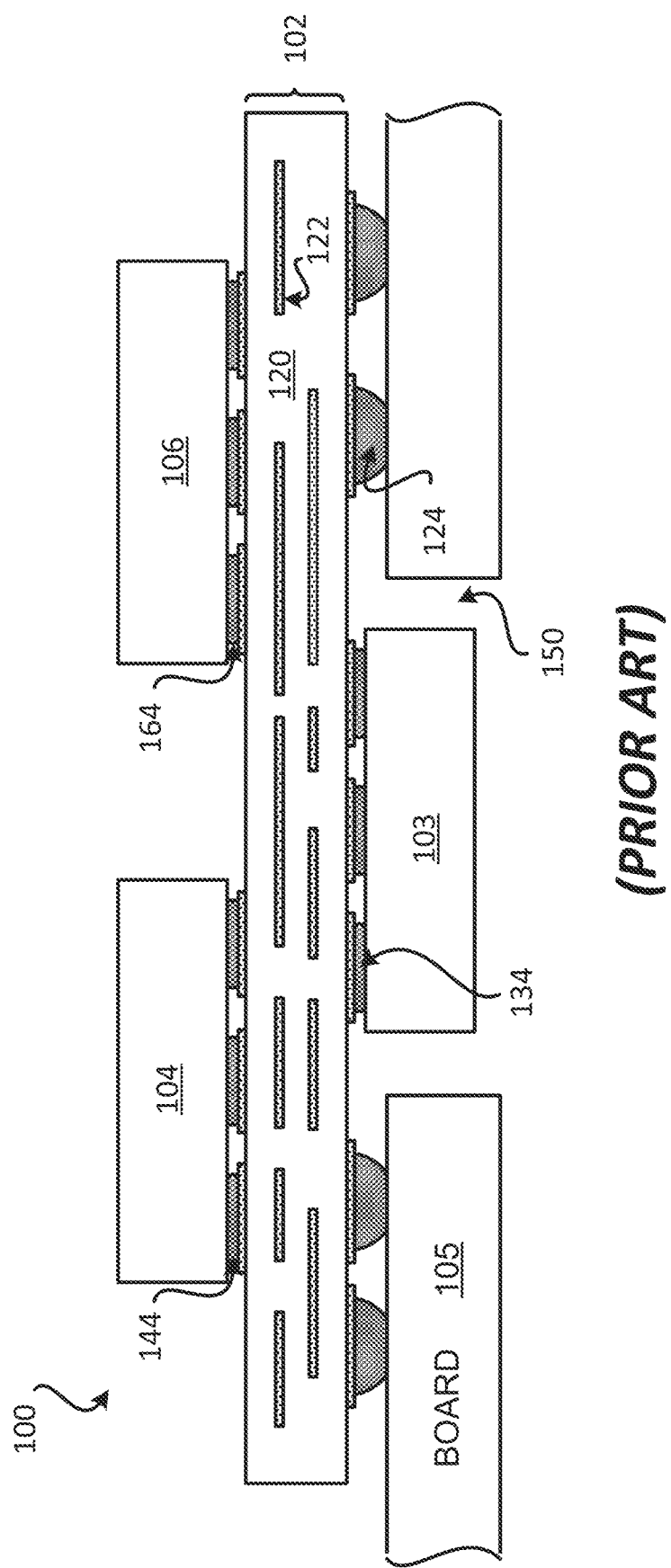
FIG. 1 illustrates a profile view of a package coupled to a board.
Figure 2:
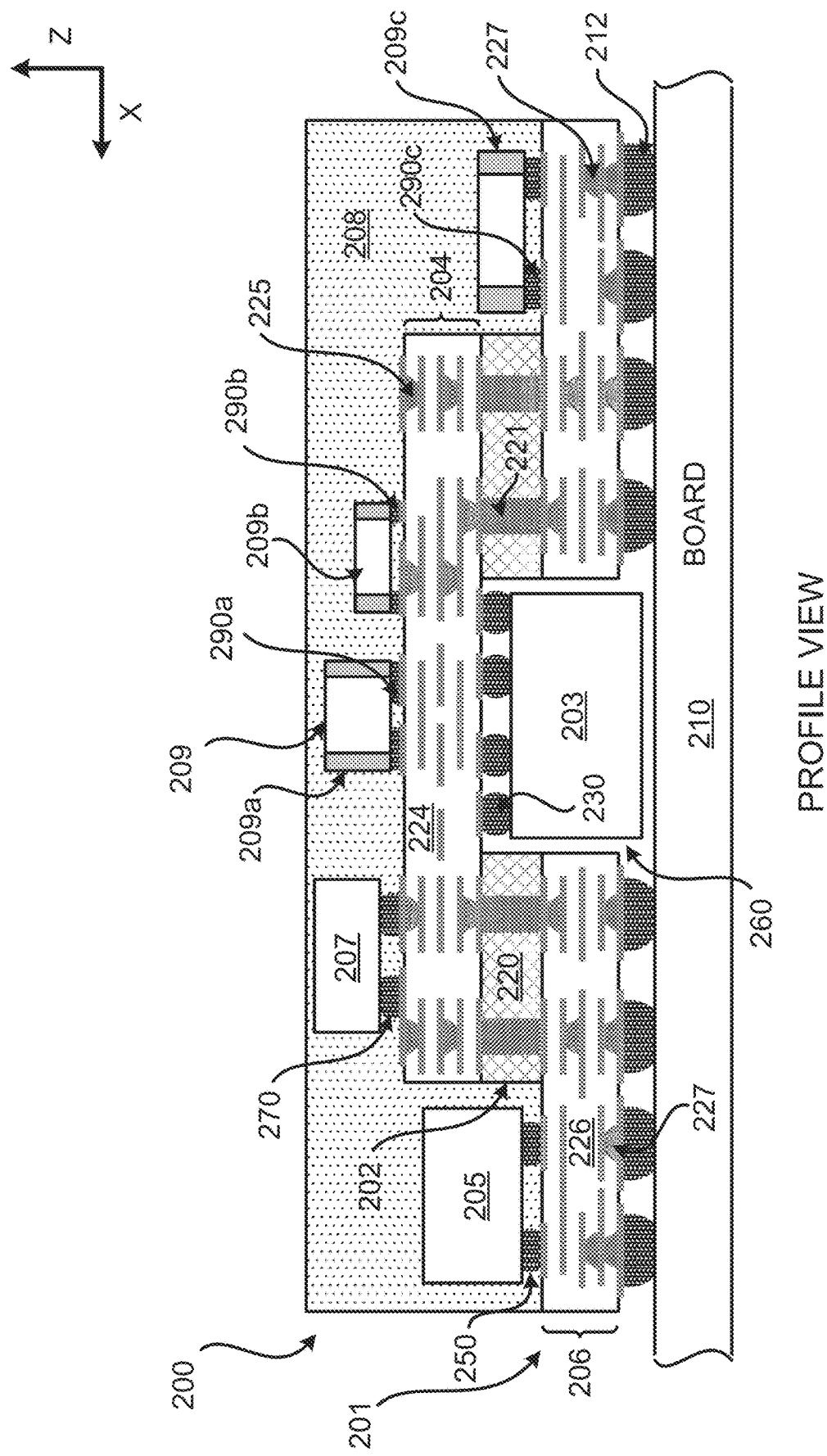
FIG. 2 illustrates a profile view of a package that includes a step-shaped substrate.

FIG. 2 illustrates a profile view of a package 200 that includes a step-shaped substrate. The package 200 is coupled to a board 210 through a plurality of solder interconnects 212. The board 210 may include a printed circuit board (PCB).

The package 200 includes a substrate 201, an integrated device 203, an integrated device 205, an integrated device 207, an encapsulation layer 208, and a plurality of passive devices 209 (e.g., 209a, 209b, 209c). The substrate 201 may include a step-shaped substrate. The substrate 201 may have a variable thickness (e.g., non-uniform thickness).

The substrate 201 includes a core portion 202, a first substrate portion 204 and a second substrate portion 206. The core portion 202 includes a first surface (e.g., top surface) and a second surface (e.g., bottom surface). The second surface of the core portion 202 may be opposite to the first surface of the core portion 202. The first substrate portion 204 is coupled to the first surface of the core portion 202. The second substrate portion 206 is coupled to the second surface of the core portion 202. The core portion 202 includes a core layer 220 and a plurality of core interconnects 221. The core layer 220 includes a first surface and a second surface. The second surface of the core layer 220 may be opposite to the first surface of the core layer 220. The plurality of core interconnects 221 is located in the core layer 220. The plurality of core interconnects 221 may extend through the core layer 220. The plurality of core interconnects 221 may include core via interconnects.

The first substrate portion 204 includes at least one first dielectric layer 224 and a first plurality of interconnects 225. The at least one first dielectric layer 224 is coupled to the first surface of the core layer 220. The first plurality of interconnects 225 is located in and/or over the at least one first dielectric layer 224. The first plurality of interconnects 225 is configured to be coupled to the plurality of core interconnects 221. The second substrate portion 206 is coupled to the second surface of the core portion 202. The second substrate portion 206 includes at least one second dielectric layer 226 and a second plurality of interconnects 227. The at least one second dielectric layer 226 is coupled to the core layer 220. The second plurality of interconnects 227 is located in and/or over the at least one second dielectric layer 226. The second plurality of interconnects 227 is configured to be coupled to the plurality of core interconnects 221. The core portion 202 and the second substrate portion 206 include a cavity 260. The cavity 260 may be a cavity (e.g., opening) in the core portion 202 and the second substrate portion 206. The cavity 260 may extend through the at least one second dielectric layer 226 and the core layer 220.

The integrated device 203 is located (at least partially) in the cavity 260 of the core portion 202 and the second substrate portion 206. The integrated device 203 is coupled to the first substrate portion 204 through the cavity 260 of the second substrate portion 206 and the core portion 202. The integrated device 203 may be coupled to a second surface (e.g., bottom surface) of the first substrate portion 204 through a plurality of solder interconnects 230. The integrated device 203 may be coupled to a second surface (e.g., bottom surface) of the first substrate portion 204. The integrated device 203 may include a front side and a back side. The front side of the integrated device 203 may face the first substrate portion 204.

The integrated device 205 is coupled to the first surface of the second substrate portion 206, through a plurality of solder interconnects 250. The integrated device 205 may be located laterally to the core portion 202 and/or the first substrate portion 204. The integrated device 207 is coupled to the first surface of the first substrate portion 204, through a plurality of solder interconnects 270. The passive device 209a is coupled to the first surface of the first substrate portion 204, through at least one solder interconnects 290a. The passive device 209b is coupled to the first surface of the first substrate portion 204, through at least one solder interconnects 290b. The passive device 209c is coupled to the first surface of the second substrate portion 206, through at least one solder interconnects 290c. The passive device 209c may be located laterally to the core portion 202 and/or the first substrate portion 204.

An encapsulation layer 208 may be coupled to the first surface of the first substrate portion 204 and the first surface of the second substrate portion 206. The encapsulation layer 208 may encapsulate the integrated device 205, the integrated device 207, and the passive devices 209a-209c. The encapsulation layer 208 may include a mold, a resin and/or an epoxy. The encapsulation layer 208 may be a means for encapsulation. A compression and transfer molding process, a sheet molding process, or a liquid molding process may be used to form the encapsulation layer.

The core layer 220 may include glass, quartz, and/or reinforced fiber. The first substrate portion 204, the second substrate portion 206 and the core portion 202 may collectively include a side profile U shape. The side profile U shape may include an upright U shape or an upside-down U shape. The first substrate portion 204, the second substrate portion 206 and the core portion 202 may collectively include a step shape. As shown in FIG. 2, a portion of the first substrate portion 204 does not vertically overlap with another portion of the second substrate portion 206. The integrated device 203 is coupled to a region of the first substrate portion 204 that does not vertically overlap with the core portion 202 and the second substrate portion 206. The at least one first dielectric layer 224 and/or the at least one second dielectric layer 226 may include prepreg. The first substrate portion 204 and/or the second substrate portion 206 may be build up layers of the substrate 201.

The first plurality of interconnects 225 is coupled to the plurality of core interconnects 221 such that a coupling between the first plurality of interconnects 225 and the plurality of core interconnects 221 is free of a solder interconnect. For example, there may not be any solder interconnect between the first plurality of interconnects 225 and the plurality of core interconnects 221.

The second plurality of interconnects 227 is coupled to the plurality of core interconnects 221 such that a coupling between the second plurality of interconnects 227 and the plurality of core interconnects 221 is free of a solder interconnect. For example, there may not be any solder interconnect between the second plurality of interconnects 227 and the plurality of core interconnects 221. The first substrate portion 204 may include a first surface (e.g., top surface) and a second surface (e.g., bottom surface). The second surface of the first substrate portion 204 may be opposite to the first surface of the first substrate portion 204. The second substrate portion 206 may include a first surface (e.g., top surface) and a second surface (e.g., bottom surface). The second surface of the second substrate portion 206 may be opposite to the first surface of the second substrate portion 206.

FIG. 2 illustrates a package that includes a substrate 201 that is a core substrate. Different implementations may use different substrates (e.g., laminated substrate, organic substrate). For example, a package may include a coreless substrate (e.g., embedded trace substrate (ETS)) that has variable thickness, a step shape and/or a U shape.

Figure 3:
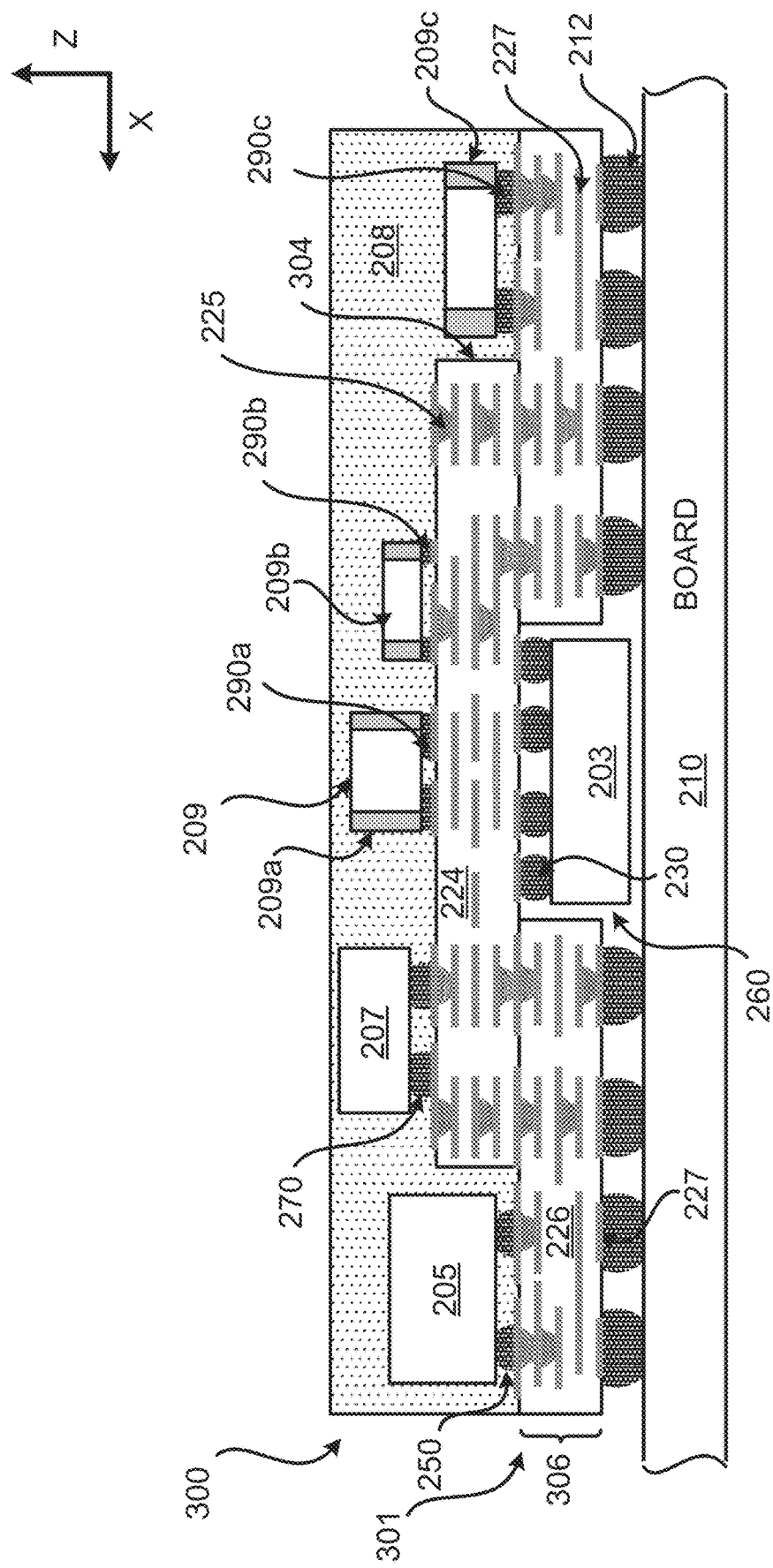
FIG. 3 illustrates a profile view of a package that includes a step-shaped substrate.

FIG. 3 illustrates a profile view of a package 300 that includes a step-shaped substrate. The package 300 is coupled to a board 210 through a plurality of solder interconnects 212. The package 300 may be similar to the package 200 of FIG. 2, and thus may include similar or the same components as the package 200. The package 300 includes a substrate 301, the integrated device 203, the integrated device 205, the integrated device 207, the encapsulation layer 208, and the plurality of passive devices 209 (e.g., 209a, 209b, 209c). The substrate 301 may include a step-shaped substrate. The substrate 301 may be coreless substrate, such as an embedded trace substrate (ETS).

The substrate 301 includes a first substrate portion 304 and a second substrate portion 306. The first substrate portion 304 is coupled to the second substrate portion 306. The first substrate portion 304 includes at least one first dielectric layer 224 and a first plurality of interconnects 225. The first plurality of interconnects 225 is located in and/or over the at least one first dielectric layer 224. The second substrate portion 306 includes at least one second dielectric layer 226 and a second plurality of interconnects 227. The first plurality of interconnects 225 is configured to be coupled to the second plurality of interconnects 227. The second plurality of interconnects 227 is located in and/or over the at least one second dielectric layer 226. The second substrate portion 306 include a cavity 260. The cavity 260 may be a cavity (e.g., opening) in the second substrate portion 306. The cavity 260 may extend through the at least one second dielectric layer 226.

The integrated device 203 is located (at least partially) in the cavity 260 of the second substrate portion 306. The integrated device 203 is coupled to the first substrate portion 304 through the cavity 260 of the second substrate portion 306. The integrated device 203 may be coupled to the first substrate portion 304 through a plurality of solder interconnects 230. The integrated device 203 may be coupled to a second surface (e.g., bottom surface) of the first substrate portion 304. The integrated device 203 may include a front side and a back side. The front side of the integrated device 203 may face the first substrate portion 304.

The integrated device 205 is coupled to the first surface of the second substrate portion 306, through a plurality of solder interconnects 250. The integrated device 205 may be located laterally to the first substrate portion 304. The integrated device 207 is coupled to the first surface of the first substrate portion 304, through a plurality of solder interconnects 270. The passive device 209a is coupled to the first surface of the first substrate portion 304, through at least one solder interconnects 290a. The passive device 209b is coupled to the first surface of the first substrate portion 304, through at least one solder interconnects 290b. The passive device 209c is coupled to the first surface of the second substrate portion 306, through at least one solder interconnects 290c. The passive device 209c may be located laterally to the first substrate portion 304. The encapsulation layer 208 may be coupled to the first surface of the first substrate portion 304 and the first surface of the second substrate portion 306. The encapsulation layer 208 may encapsulate the integrated device 205, the integrated device 207, and the passive devices 209a-209c. The encapsulation layer 208 may include a mold, a resin and/or an epoxy. The encapsulation layer 208 may be a means for encapsulation. A compression and transfer molding process, a sheet molding process, or a liquid molding process may be used to form the encapsulation layer.

The first substrate portion 304 and the second substrate portion 306 may collectively include a side profile U shape. The side profile U shape may include an upright U shape or an upside-down U shape. The first substrate portion 304 and the second substrate portion 306 may collectively include a step shape. As shown in FIG. 3, a portion of the first substrate portion 304 does not vertically overlap with another portion of the second substrate portion 306. The integrated device 203 is coupled to a region of the first substrate portion 304 that does not vertically overlap with the second substrate portion 306.

An integrated device (e.g., 203, 205, 207) may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon (Si) based integrated device, a silicon carbide (SiC) based integrated device, processor, memory and/or combinations thereof. An integrated device (e.g., 203, 205, 207) may include at least one electronic circuit (e.g., first electronic circuit, second electronic circuit, etc. . . . ). A passive device may include a surface mounted device (SMD). A passive device may include a capacitor or a resistor.

The packages (e.g., 200, 300) may be implemented as part of an application processor package and/or a power management package.

In some implementations, one or more solder resist layers may be located over surfaces of the first substrate portion (e.g., 204, 304) and/or the second substrate portion (e.g., 206, 306). For example, a solder resist layer may be located over the first surface (e.g., top surface) of the first substrate portion 204, and another solder resist layer may be located over the second surface (e.g., bottom surface) of the second substrate portion 206. The first substrate portion may be a top substrate portion and the second substrate portion may be a bottom substrate portion. The first substrate portion and/or the second substrate portion may include build up layers.

The packages 200 and 300 include a second substrate portion (e.g., 206, 306) that has a length and/or width (including the size of the cavity 260) that is longer than a length and/or width of the first substrate portion (e.g., 204, 306). The core portion 202 may have a length and/or width (including the size of the cavity 260) that is the same or similar to a length and/or width of the first substrate portion (e.g., 204, 304). The core portion 202 may have a length and/or width (including the size of the cavity 260) that is the different (e.g., less) than a length and/or width (including the size of the cavity 260) of the second substrate portion (e.g., 206, 306). The integrated device 205 and the passive device 209c may be located along a periphery of the second substrate portion (e.g., 206, 306) and/or the package (e.g., 200, 300). The front side of the integrated device 203 may face a different direction (e.g., opposite direction) than the front side of other integrated devices (e.g., 205, 207). For example, the front side of the integrated device 203 may face the first substrate portion and the front side of the integrated device 205 may have the second substrate portion. The passive device 209c and the integrated device 205 may be located at least partially laterally to the integrated device 203. As shown in at least FIGS. 2-3, the distance between the first substrate portion (e.g., 204, 304) and the board 210, is greater than the height of the integrated device 203. The cavity 260 may have a depth that is smaller, equal or greater than the thickness of the integrated device 203.

The configurations and designs of the packages 200 and 300 provide packages with a relatively low thickness, that is robust and reliable. The packages 200 and 300 may be coupled to the board 210 without the need of the board 210 to include a cavity. Since there is no need for a cavity in the board 210, the overall assembly of the package and the board 210 is mechanically and structurally stronger than it would otherwise be if a big cavity were to be present in the board 210. Moreover, since there is no cavity in the board 210, more of the board 210 can be used to for routing and there is less wasted space in the board 210. In particular, a first substrate portion (e.g., 204, 304), a core portion 202 and/or a second substrate portion (e.g., 206, 306) that are coupled together without the need of solder interconnects helps provide a robust and reliable substrate that has a smaller form factor (e.g., thinner substrate thickness). For example, without the need of solder interconnects to couple the first substrate portion, the core portion and/or the second substrate portion to each other, the substrate has an overall thinner thickness. Moreover, avoiding the use of solder interconnects to couple (i) the first substrate portion and the core portion, (ii) the second substrate portion and the core portion, and/or (iii) the first substrate portion and the second substrate portion, improves and increases the reliability of the substrate because the process of providing solder interconnects can cause cracks in the substrate. Thus, by minimizing and/or reducing the use of solder interconnects, the substrate is subject to less stress during the fabrication, which can translate to a substrate with less cracks.

Having described various packages and substrates with an improved configuration, a sequence for fabricating a substrate and a package will now be described below.

Exemplary Sequence for Fabricating a Substrate

FIGS. 4A-4G illustrate an exemplary sequence for providing or fabricating a substrate. In some implementations, the sequence of FIGS. 4A-4G may be used to provide or fabricate a substrate, which can then be used as the substrate 201 of FIG. 2, or any of the substrates described in the disclosure.

It should be noted that the sequence of FIGS. 4A-4G may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 4A:
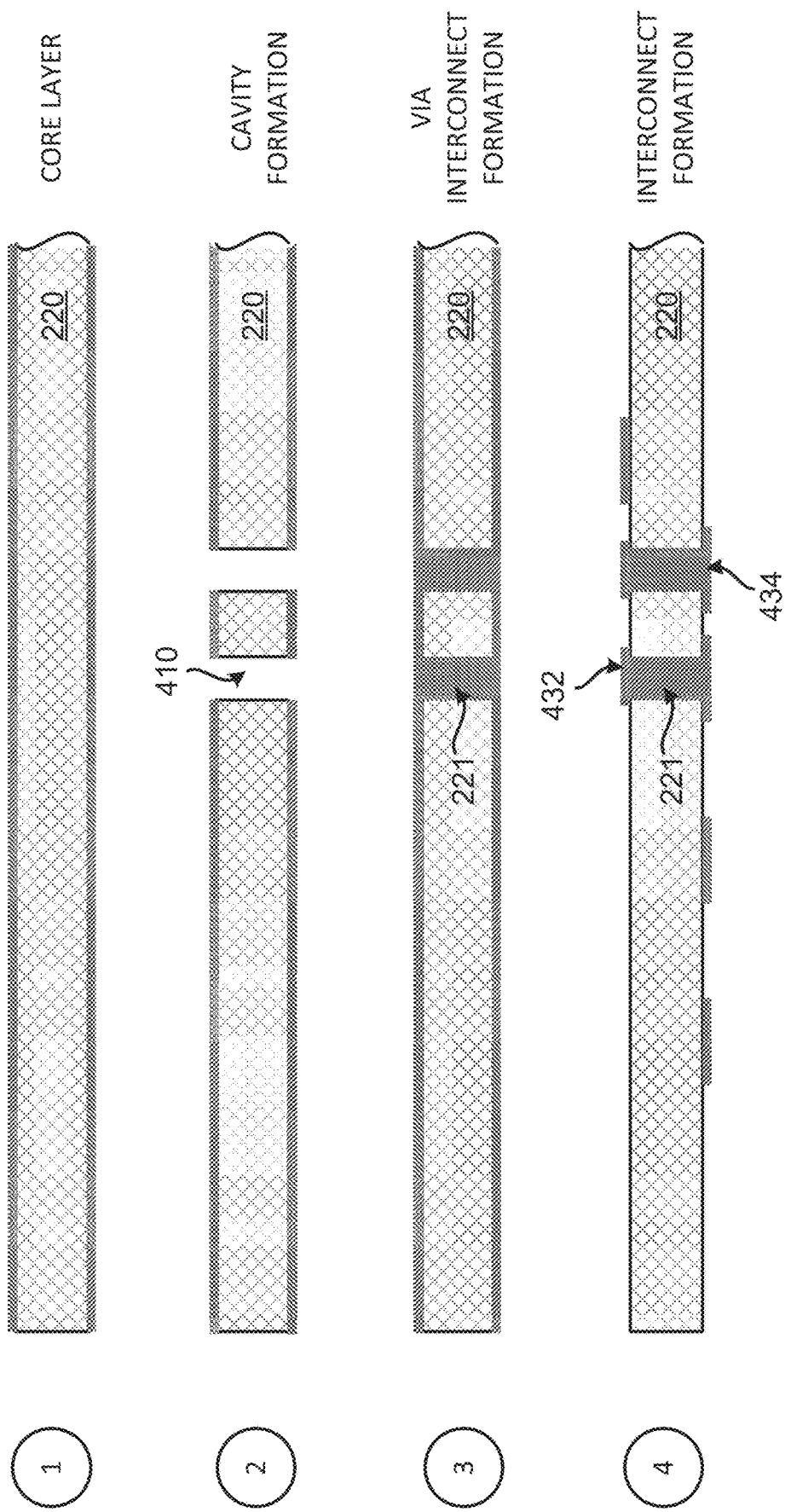
FIGS. 4A-4G illustrate an exemplary sequence for fabricating a substrate.

Stage 1, as shown in FIG. 4A, illustrates a state after a core layer 220 is provided. The core layer 220 may include glass or glass fiber with resin. However, the core layer 220 may include different materials, such as glass and/or quartz. The core layer 220 may have different thicknesses. The core layer 220 may include a copper clad laminate (CCL). The core layer 220 may include a first metal layer and a second metal layer.

Stage 2 illustrates a state after a plurality of cavities 410 is formed in the core layer 220. The plurality of cavities 410 may be formed through a laser process and/or a drilling process. The plurality of cavities 410 may extend and/or travel through the core layer 220.

Stage 3 illustrates a state after a plurality of core interconnects are formed in the plurality of cavities 410. For example, a plurality of core interconnects 221 may be formed in the plurality of cavities 410. A plating process may be used to form the plurality of core interconnects 221. However, different implementations may use different processes (e.g., pasting process) for forming the plurality of core interconnects 221. The plurality of core interconnects 221 may include core via interconnects located in the core layer 220.

Stage 4 illustrates a state after a plurality of interconnects 432 is formed over the first surface (e.g., top surface) of the core layer 220. The plurality of interconnects 432 may be coupled to the plurality of core interconnects 221. Stage 4 also illustrates a state after a plurality of interconnects 434 is formed over the second surface (e.g., bottom surface) of the core layer 220. The plurality of interconnects 434 may be coupled to the plurality of core interconnects 221. A patterning process, a stripping process and/or a plating process may be used to form the plurality of interconnects 432 and the plurality of interconnects 434.

Figure 4B:
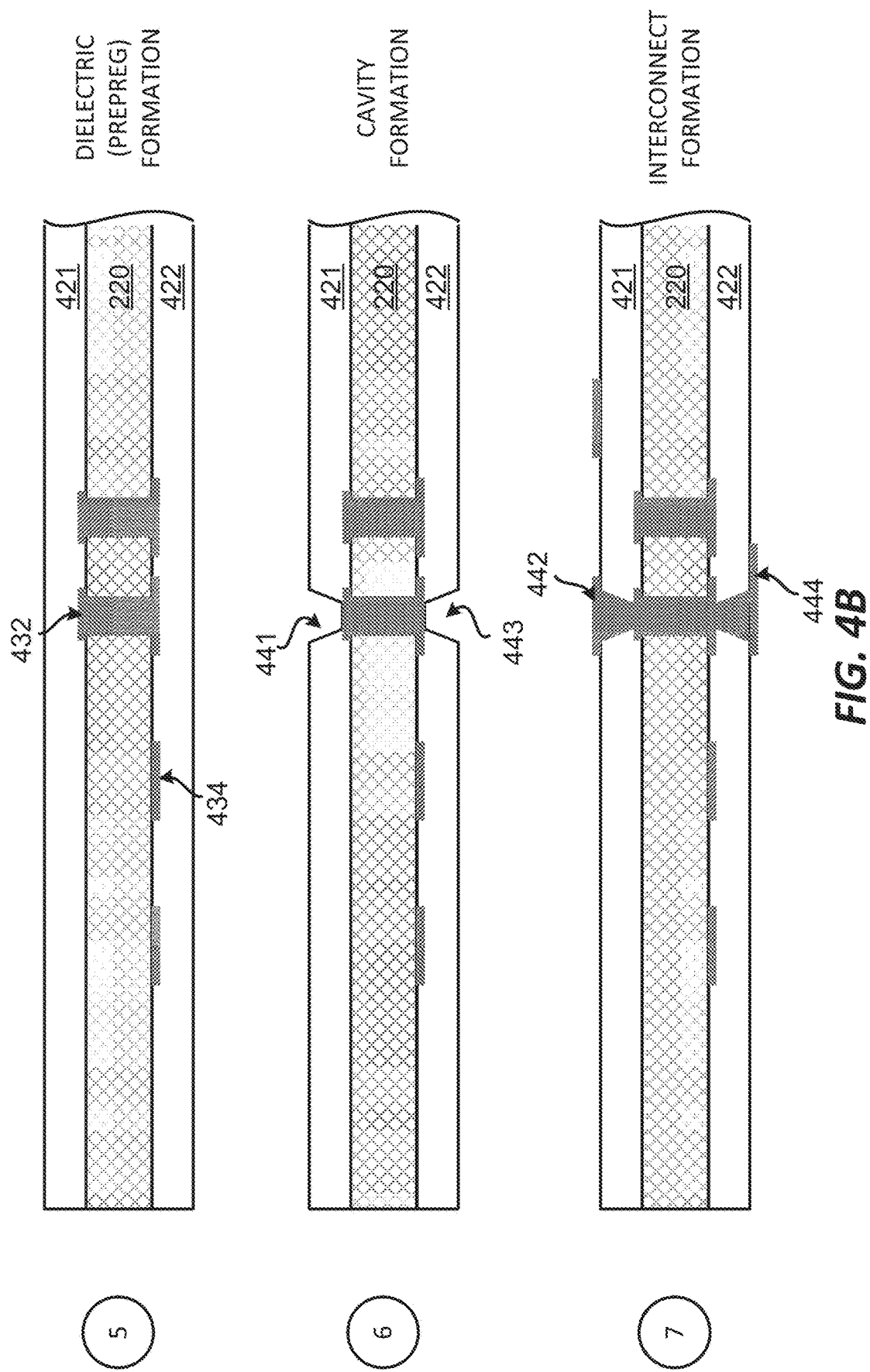

Stage 5, as shown in FIG. 4B, illustrates a state after a dielectric layer 421 is formed over the first surface of the core layer 220, and a dielectric layer 422 is formed over the second surface of the core layer 220. A deposition process and/or lamination process may be used to form dielectric layers 421 and 422. The dielectric layers 421 and 422 may include prepreg (e.g., prepreg layers).

Stage 6 illustrates a state after a plurality of cavities 441 is formed in the dielectric layer 421, and a plurality of cavities 443 is formed in the dielectric layer 422. A laser process (e.g., laser drilling, laser ablation) may be used to form the plurality of cavities 441 and the plurality of cavities 443.

Stage 7 illustrates a state after a plurality of interconnects 442 is formed over and coupled to the dielectric layer 421 and the plurality of cavities 441. The plurality of interconnects 442 may be coupled to the plurality of interconnects 432. Stage 7 also illustrates a state after a plurality of interconnects 444 is formed over and coupled the dielectric layer 422 and the plurality of cavities 443. The plurality of interconnects 444 may be coupled to the plurality of interconnects 434. A patterning process, a stripping process and/or a plating process may be used to form the plurality of interconnects 442 and the plurality of interconnects 444.

Figure 4C:
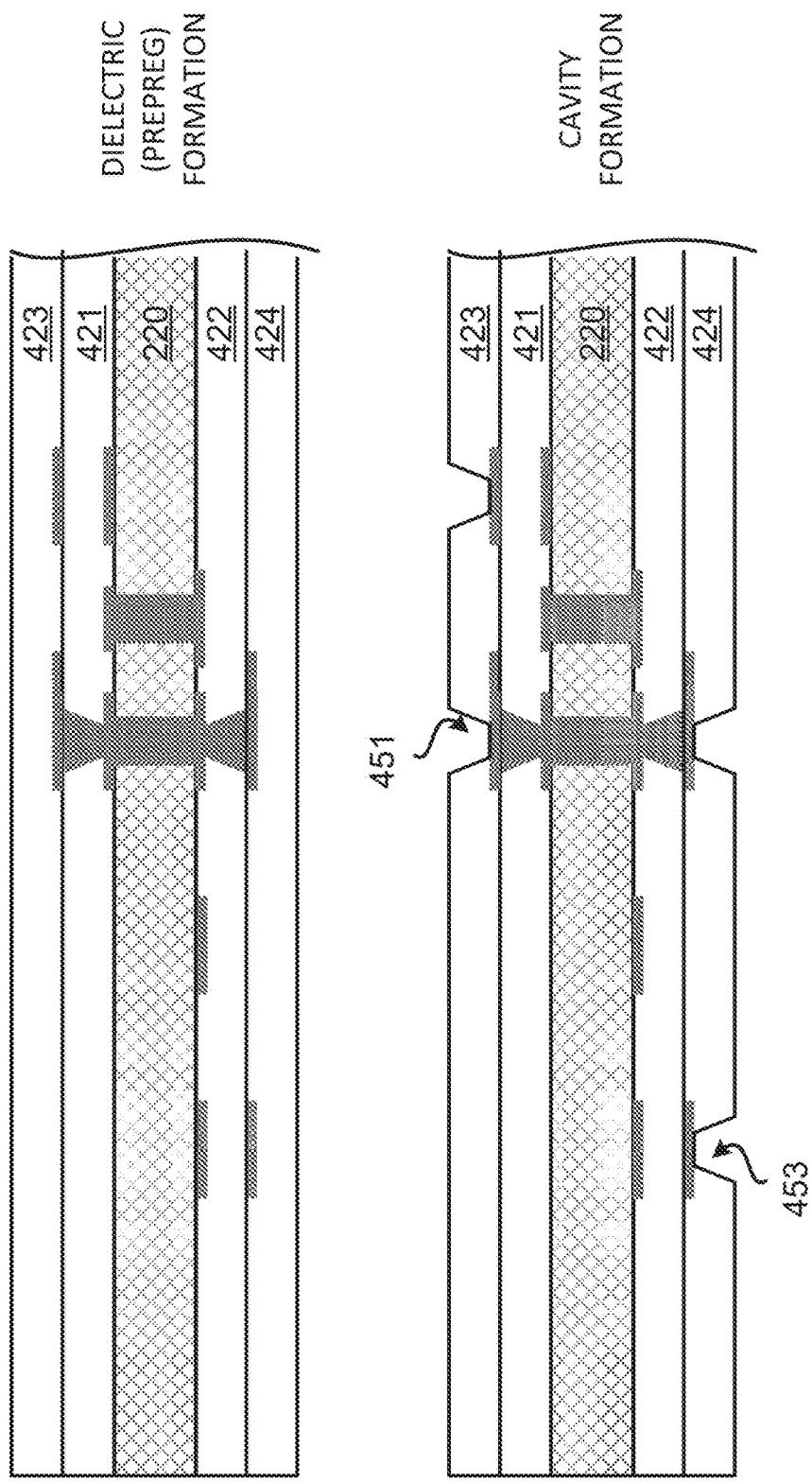

Stage 8, as shown in FIG. 4C, illustrates a state after a dielectric layer 423 is formed over and coupled to a first surface of dielectric layer 421, and a dielectric layer 424 is formed over and coupled to a second surface of the dielectric layer 422. A deposition process and/or lamination process may be used to form dielectric layers 423 and 424. The dielectric layers 423 and 424 may include prepreg (e.g., prepreg layers).

Stage 9 illustrates a state after a plurality of cavities 451 is formed in the dielectric layer 423, and a plurality of cavities 453 is formed in the dielectric layer 424. A laser process (e.g., laser drilling, laser ablation) may be used to form the plurality of cavities 451 and the plurality of cavities 453.

Figure 4D:
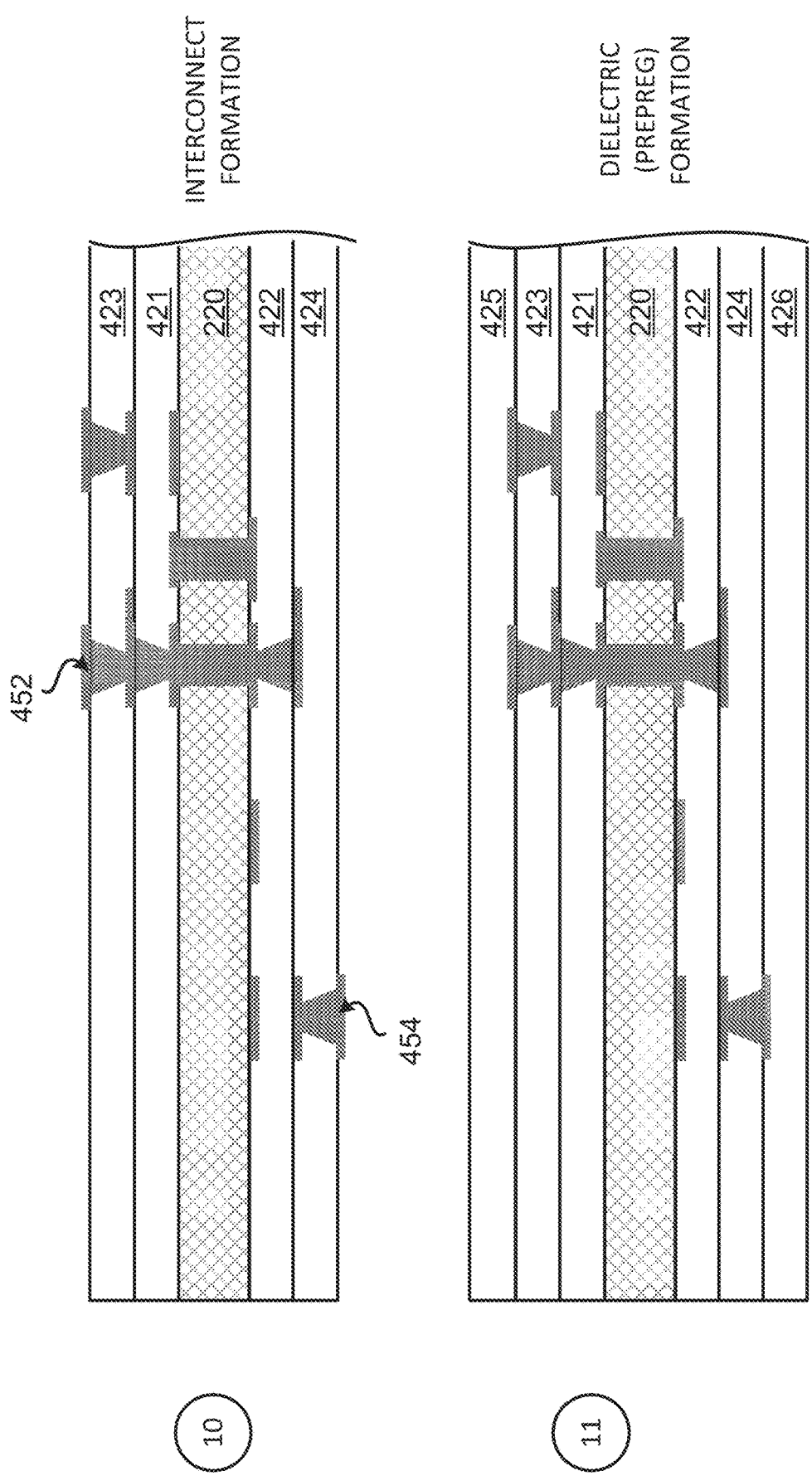

Stage 10, as shown in FIG. 4D, illustrates a state after a plurality of interconnects 452 is formed over and coupled to the dielectric layer 423 and the plurality of cavities 451. The plurality of interconnects 452 may be coupled to the plurality of interconnects 442. Stage 10 also illustrates a state after a plurality of interconnects 454 is formed over and coupled to the dielectric layer 424 and the plurality of cavities 453. The plurality of interconnects 454 may be coupled to the plurality of interconnects 444. A patterning process, a stripping process and/or a plating process may be used to form the plurality of interconnects 452 and the plurality of interconnects 454.

Stage 11 illustrates a state after a dielectric layer 425 is formed over and coupled to a first surface of dielectric layer 423, and a dielectric layer 426 is formed over and coupled to a second surface of the dielectric layer 424. A deposition process and/or lamination process may be used to form dielectric layers 425 and 426. The dielectric layers 425 and 426 may include prepreg (e.g., prepreg layers).

Figure 4E:
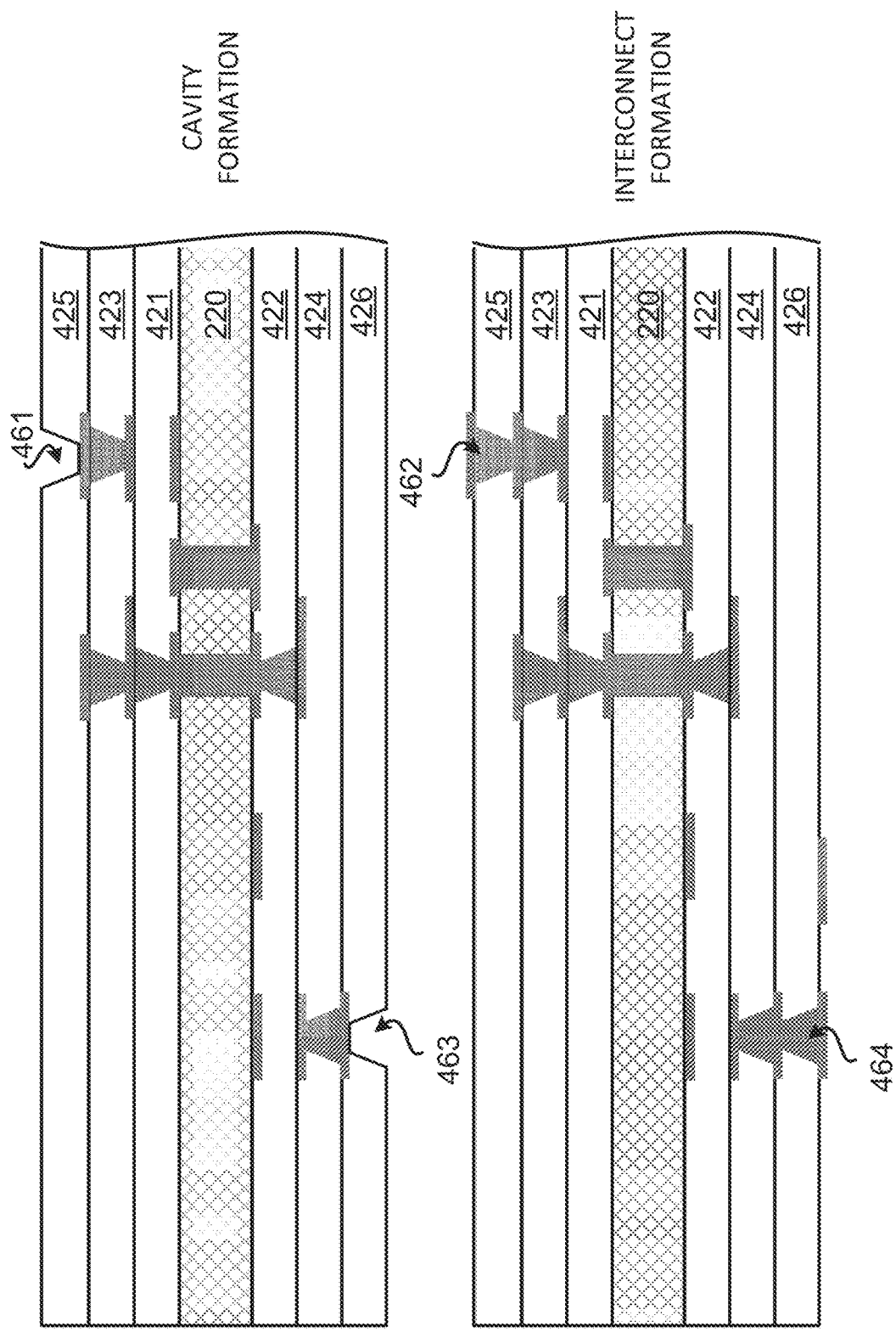

Stage 12, as shown in FIG. 4E, illustrates a state after a plurality of cavities 461 is formed in the dielectric layer 425, and a plurality of cavities 463 is formed in the dielectric layer 426. A laser process (e.g., laser drilling, laser ablation) may be used to form the plurality of cavities 461 and the plurality of cavities 463.

Stage 13 illustrates a state after a plurality of interconnects 462 is formed over and coupled to the dielectric layer 425 and the plurality of cavities 461. The plurality of interconnects 462 may be coupled to the plurality of interconnects 452. Stage 13 also illustrates a state after a plurality of interconnects 464 is formed over and coupled to the dielectric layer 426 and the plurality of cavities 463. The plurality of interconnects 464 may be coupled to the plurality of interconnects 454. A patterning process, a stripping process and/or a plating process may be used to form the plurality of interconnects 462 and the plurality of interconnects 464.

Figure 4F:
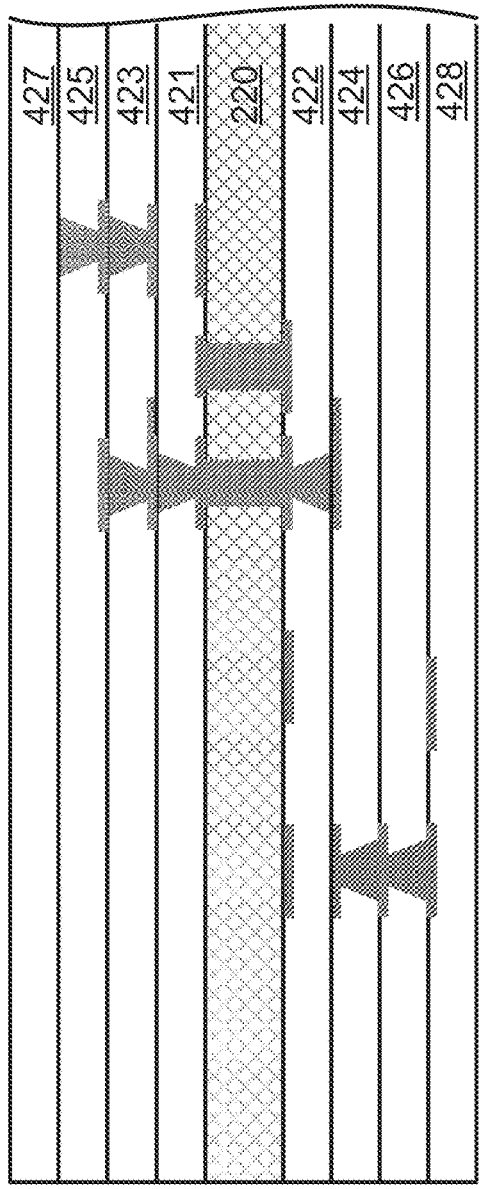
Figure 4F:
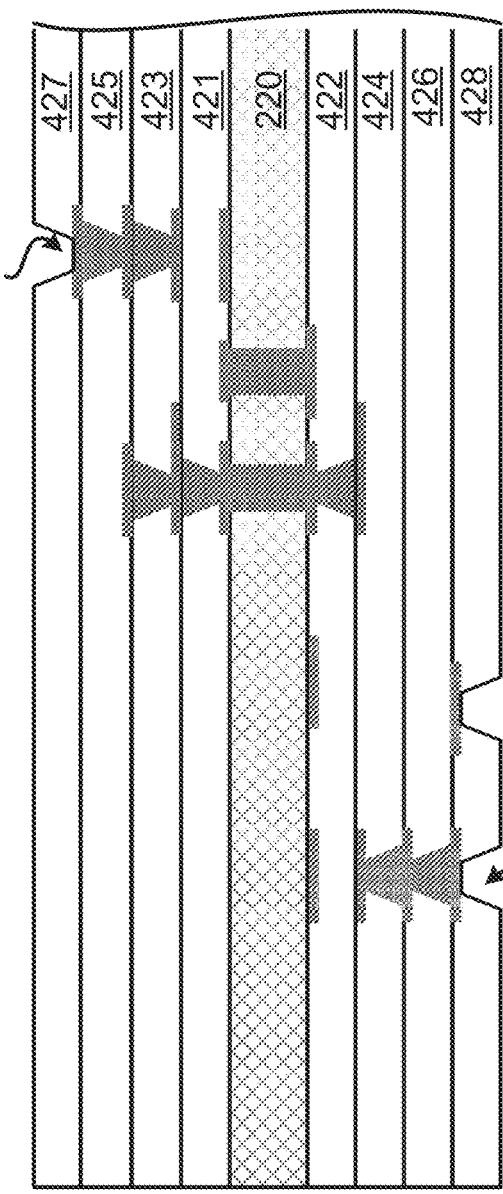
Figure 4G:
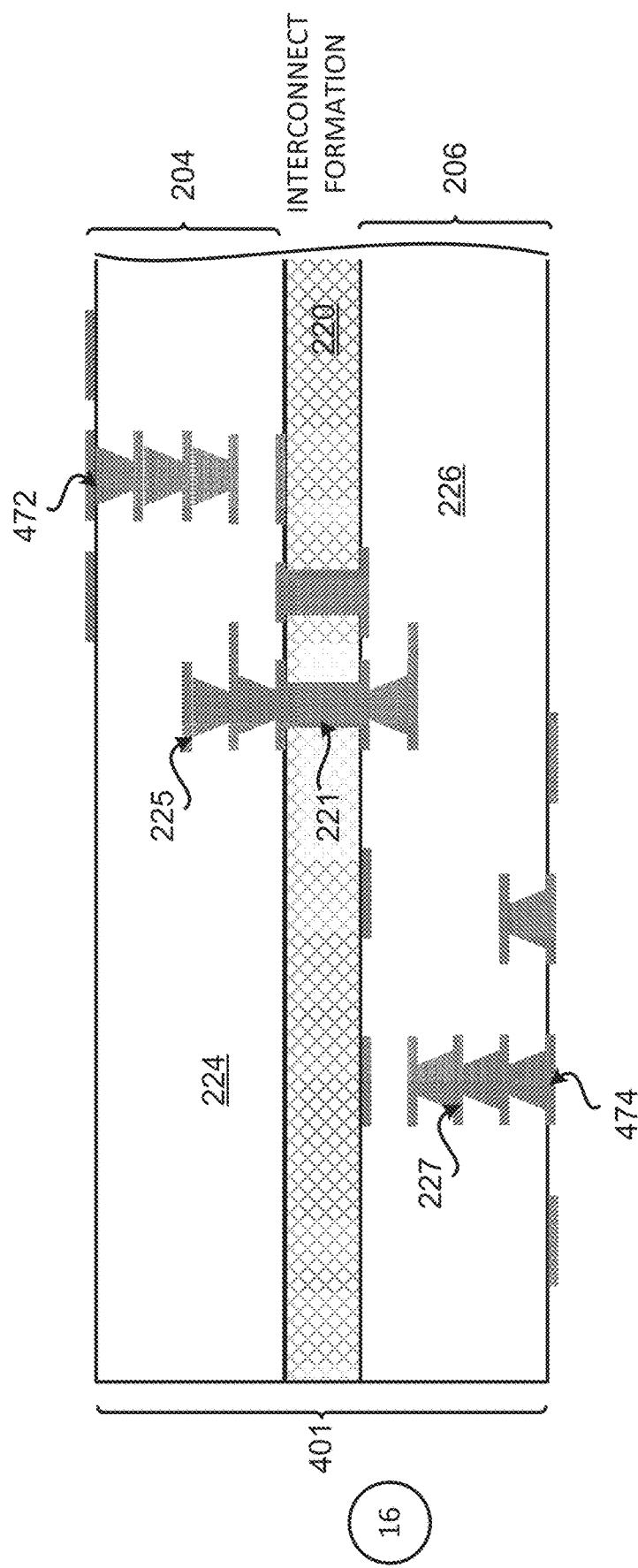

Stage 14, as shown in FIG. 4F, illustrates a state after a dielectric layer 427 is formed over and coupled to a first surface of dielectric layer 425, and a dielectric layer 428 is formed over and coupled to a second surface of the dielectric layer 426. A deposition process and/or lamination process may be used to form dielectric layers 427 and 428. The dielectric layers 427 and 428 may include prepreg (e.g., prepreg layers).

Stage 15 illustrates a state after a plurality of cavities 471 is formed in the dielectric layer 427, and a plurality of cavities 473 is formed in the dielectric layer 428. A laser process (e.g., laser drilling, laser ablation) may be used to form the plurality of cavities 471 and the plurality of cavities 473.

Stage 16 illustrates a state after a plurality of interconnects 472 is formed over and coupled to the dielectric layer 427 and the plurality of cavities 471. The plurality of interconnects 472 may be coupled to the plurality of interconnects 462. Stage 16 also illustrates a state after a plurality of interconnects 474 is formed over and coupled to the dielectric layer 428 and the plurality of cavities 473. The plurality of interconnects 474 may be coupled to the plurality of interconnects 464. A patterning process, a stripping process and/or a plating process may be used to form the plurality of interconnects 472 and the plurality of interconnects 474.

Stage 16 may illustrate a substrate 401 that includes the core layer 220, the plurality of core interconnects 221, at least one first dielectric layer 224, a plurality of interconnects 225, at least one second dielectric layer 226 and a plurality of interconnects 227. The at least one first dielectric layer 224 may represent the dielectric layers 421, 423, 425 and/or 427. The plurality of interconnects 225 may represent the interconnects 432, 442, 452, 462 and/or 472. The at least one second dielectric layer 226 may represent the dielectric layers 422, 424, 426 and/or 428. The plurality of interconnects 227 may represent the interconnects 434, 444, 454, 464 and/or 474. Different implementations may have different numbers of dielectric layers and/or metal layers. In the example of FIGS. 4A-4G, the substrate 401 includes 10 metal layers. As will be shown below in FIGS. 5A-5D, the substrate 401 may be used to form a step shaped substrate in a package.

As mentioned above, the sequence shown in FIGS. 4A-4G may be used to fabricate any substrate. In some implementations, a sequence and/or or process similar to FIGS. 4A-4G may be used to fabricate a coreless substrate. In some implementations, a coreless substrate may be fabricated using a different process than the process shown in FIGS. 4A-4G. For example, a coreless substrate may be fabricated using an embedded trace substrate (ETS) process.

Exemplary Sequence for Fabricating a Package Comprising a Step-Shaped Substrate

FIGS. 5A-5D illustrate an exemplary sequence for providing or fabricating a package that includes a step-shaped substrate. In some implementations, the sequence of FIGS. 5A-5G may be used to provide or fabricate the package 200, or any of the packages described in the disclosure.

It should be noted that the sequence of FIGS. 5A-5D may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure. Different implementations may fabricate a substrate differently.

Figure 5A:
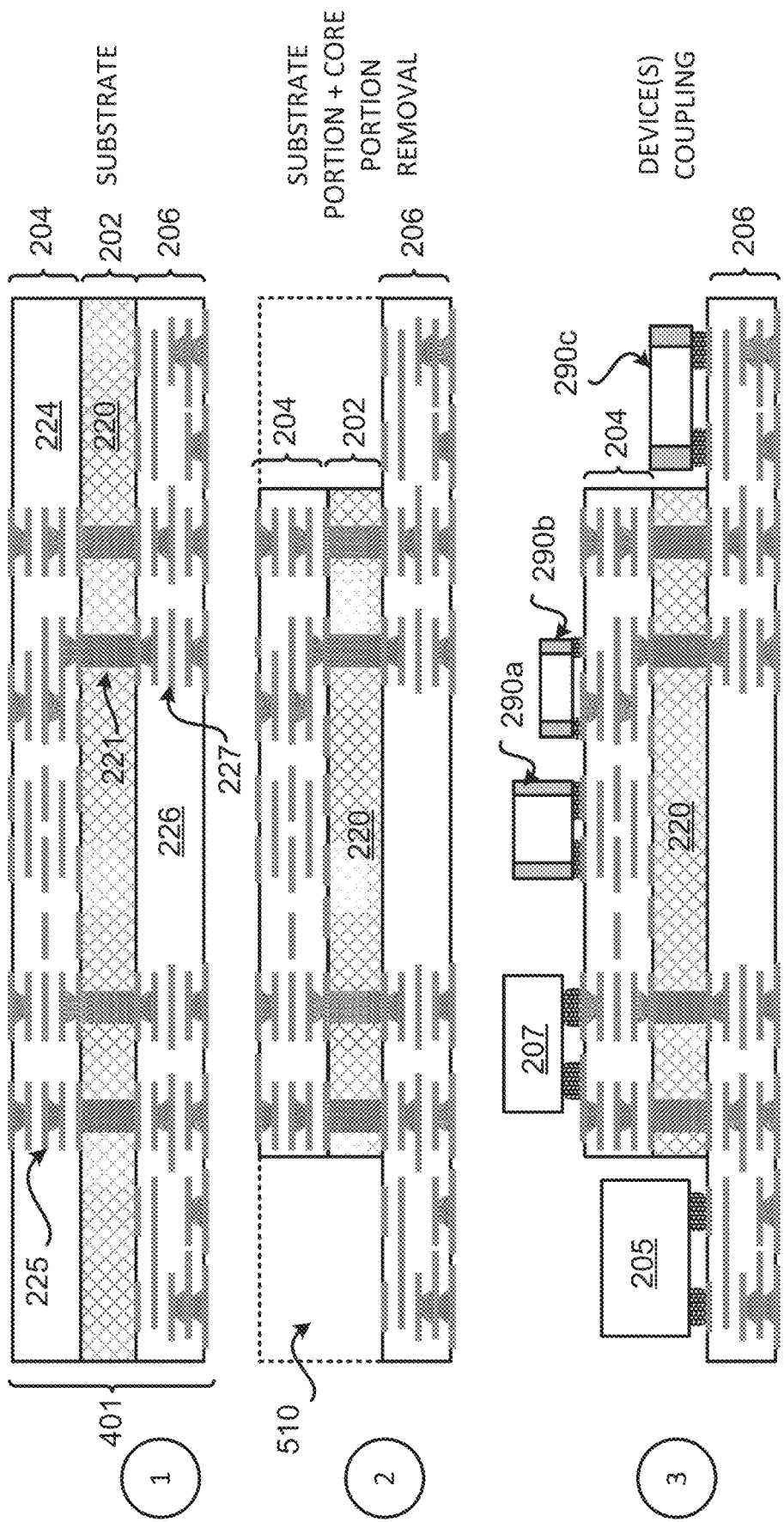
FIGS. 5A-5D illustrate an exemplary sequence for fabricating a package that includes an integrated device and a step-shaped substrate.

Stage 1, as shown in FIG. 5A, illustrates a state after a substrate 401 is provided. The substrate 401 may be fabricated or provided by a supplier. The substrate 401 may include a core substrate. For example, the substrate 401 may include a core layer 220, the plurality of core interconnects 221, at least one first dielectric layer 224, a plurality of interconnects 225, at least one second dielectric layer 226 and a plurality of interconnects 227. The substrate 401 includes the core portion 202, the first substrate portion 204 and the second substrate portion 206. The substrate 401 may be fabricated using the process described in FIGS. 4A-4G. In some implementations, a coreless substrate may be provided. A coreless substrate may be similar to a core substrate. However, the coreless substrate may be free of a core layer. An example of a coreless substrate that may be provided by a supplier may be similar to the substrate 401 without the core layer 220. In one example, a coreless substrate may be similar to the first substrate portion 204 and/or the second substrate portion 206.

Stage 2 illustrates a state after portions of the core portion 202 and portions of the first substrate portion 204 are removed. The portion 510 may represent portions of the core portion 202 and portions of the first substrate portion 204 that are removed. Different implementations may remove the portions differently. A sand blasting and/or an etching process may be used to remove portions of the core portion 202 and portions of the first substrate portion 204. For example, a sand blasting process may be used to remove portions of the first substrate portion 204 and an etching process and/or laser process (e.g., laser ablation) may be used to removed portions of the core portion 202. Removing portions of the first substrate portion 204 may include removing some of the at least one first dielectric layer 224. Removing portions of the core portion 202 may include removing some of the core layer 220. In some implementations, the substrate 401 may be provided with the portion 510 removed. In some implementations, the substrate 401 may be provided with a cavity 260, which is described at Stage 5 of FIG. 5B.

Stage 3 illustrates a state after a plurality of integrated devices and a plurality of passive devices are coupled to the first substrate portion 204 and the second substrate portion 206. A pick and place process with a reflow solder process may be used to place and couple the various integrated devices and passive devices. For example, the integrated device 205 and the passive device 209c are coupled to the first surface of the second substrate portion 206, and the integrated device 207 and the passive devices 209a and 209b are coupled to the first surface of the first substrate portion 204.

Figure 5B:
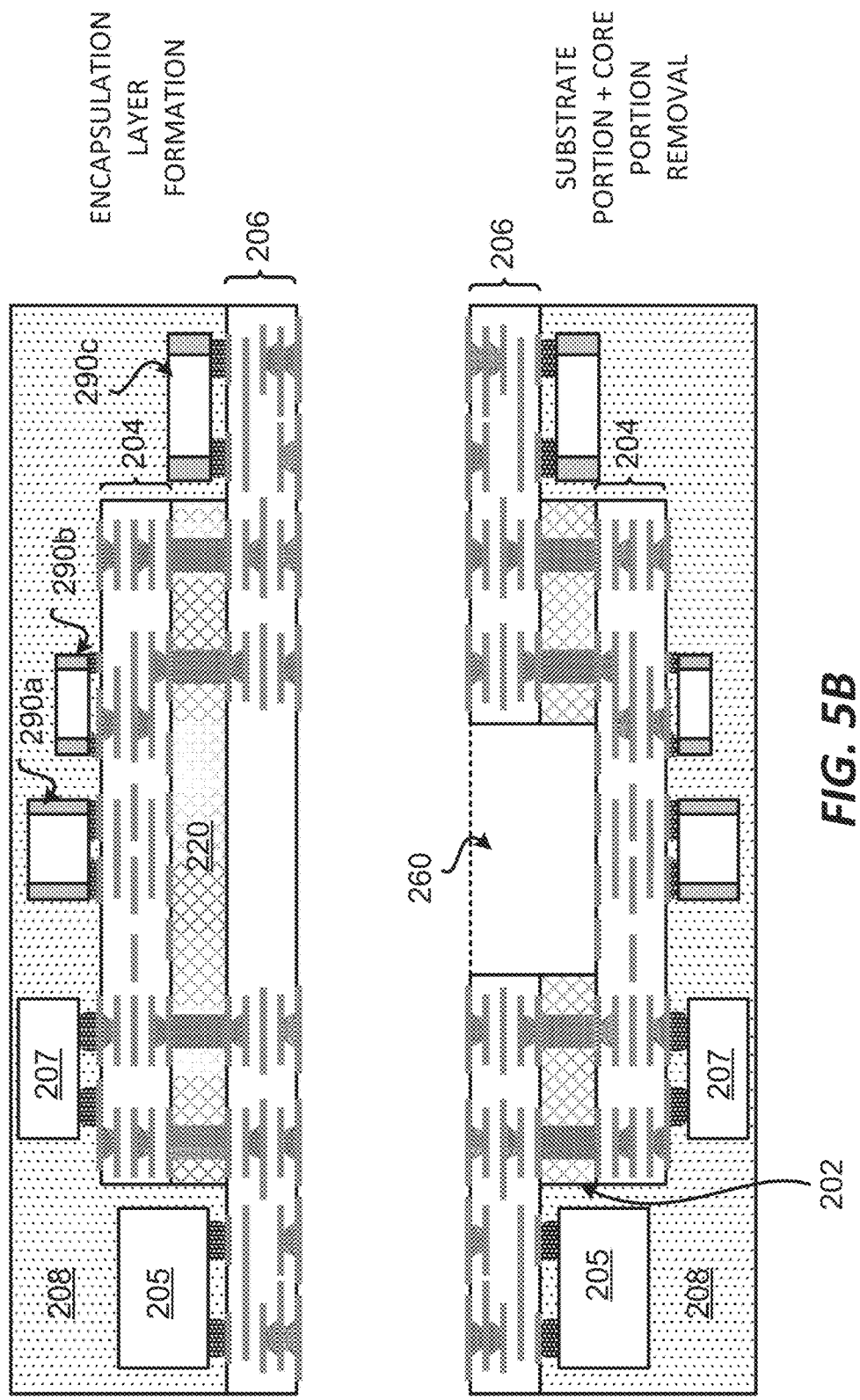

Stage 4, as shown in FIG. 5B, illustrates a state after an encapsulation layer 208 is formed over the first substrate portion 204 and the second substrate portion 206. The encapsulation layer 208 encapsulates the integrated device 205, the integrated device 207 and the plurality of passive devices 290a-290c. A compression and transfer molding process, a sheet molding process, or a liquid molding process may be used to form the encapsulation layer 208.

Stage 5 illustrates a state after portions of the core portion 202 and portions of the second substrate portion 206 are removed. Different implementations may remove the portions differently. A sand blasting and/or an etching process may be used to remove portions of the core portion 202 and portions of the second substrate portion 206. For example, a sand blasting process may be used to remove portions of the second substrate portion 206, and an etching process and/or a laser process (e.g., laser ablation) may be used to removed portions of the core portion 202. Removing portions of the second substrate portion 206 may include removing some of the at least one second dielectric layer 226. Removing portions of the core portion 202 may include removing some of the core layer 220. Removing portions of the second substrate portion 206 and portions of the core portion 202 may form a cavity 260 (e.g., opening) in the second substrate portion 206 and the core portion 202. In some implementations, the portions of the second substrate portion 206 and the core portion 202 may be removed earlier, such as before, during, and/or after stage 2 of FIG. 5A.

Figure 5C:
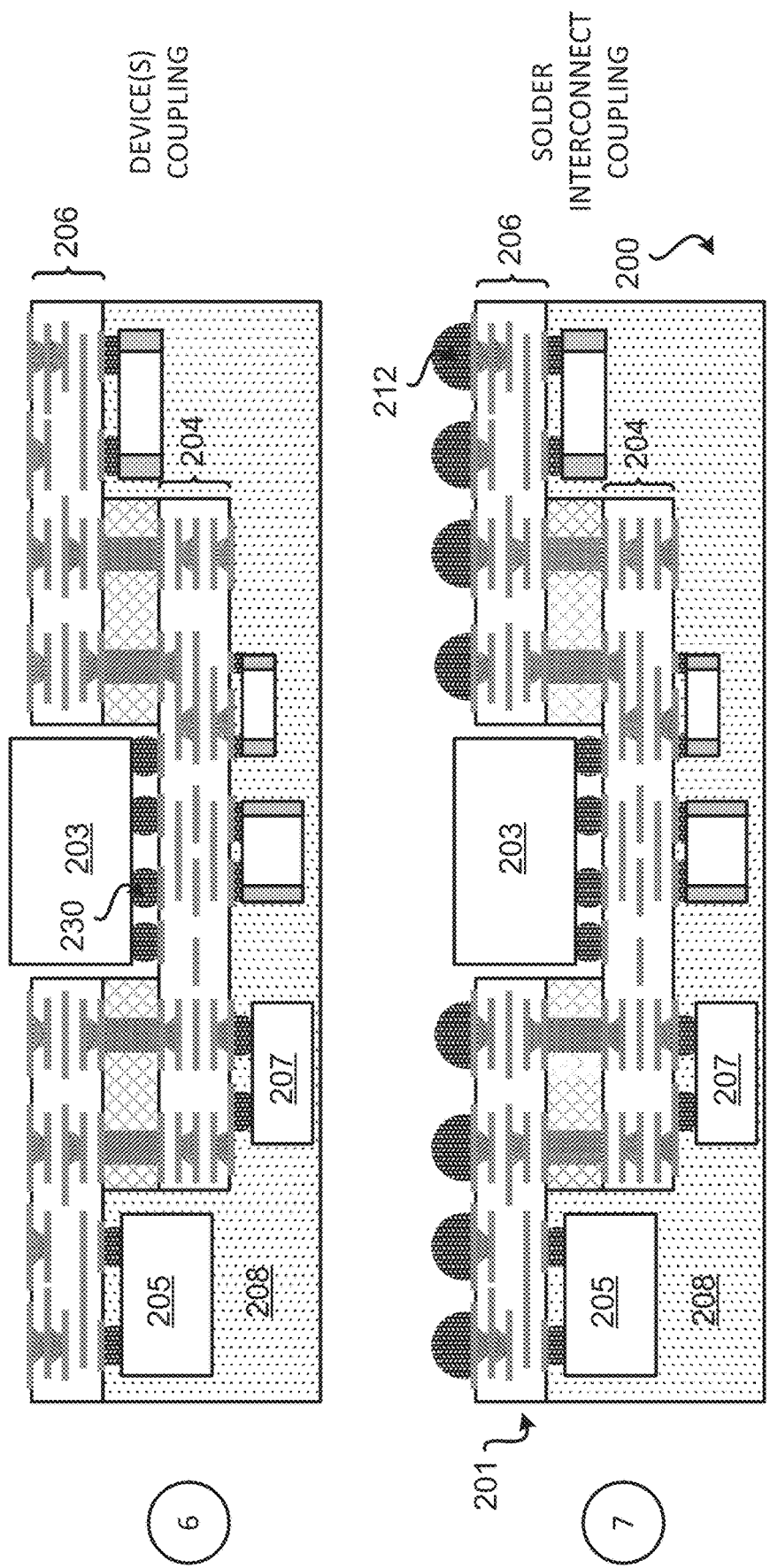

Stage 6, as shown in FIG. 5C, illustrates a state after the integrated device 203 is coupled to the first substrate portion 204 through the cavity 260 of the second substrate portion 206 and the core portion 202. A pick and place process with a reflow solder process may be used to couple the integrated device 203 to a second surface of the first substrate portion 204 through the plurality of solder interconnects 230. The front side of the integrated device 203 may face the first substrate portion 204.

Stage 7 illustrates a state after a plurality of solder interconnects 212 is coupled to the second substrate portion 206. A reflow solder process may be used to couple the plurality of solder interconnects 212 to the second substrate portion 206. Stage 7 may illustrate the package 200 that includes the substrate 201 with a step-shape.

Figure 5D:
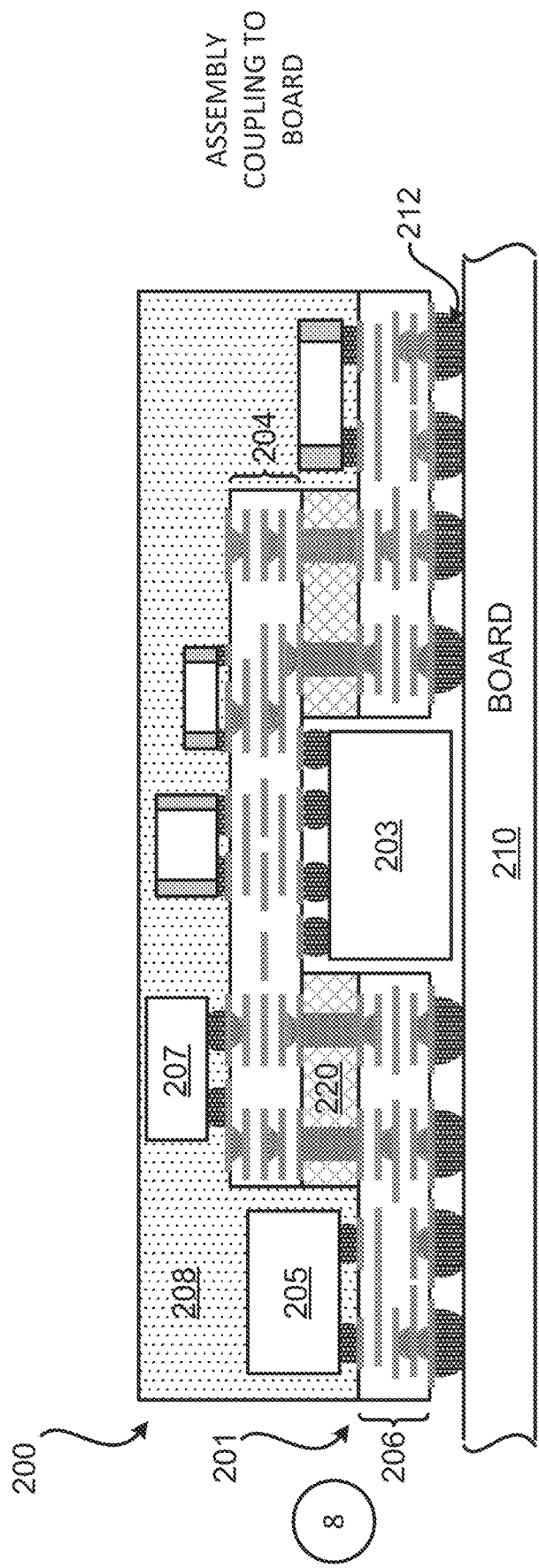

Stage 8, as shown in FIG. 5D, illustrates a state after the package 200 has been coupled to the board 210 through the plurality of solder interconnects 212. As mentioned above, the package 200 includes a core substrate that has a step shape. However, in some implementations, a package (e.g., 300) may be implemented with a coreless substrate that has a step shape.

Figure 6:
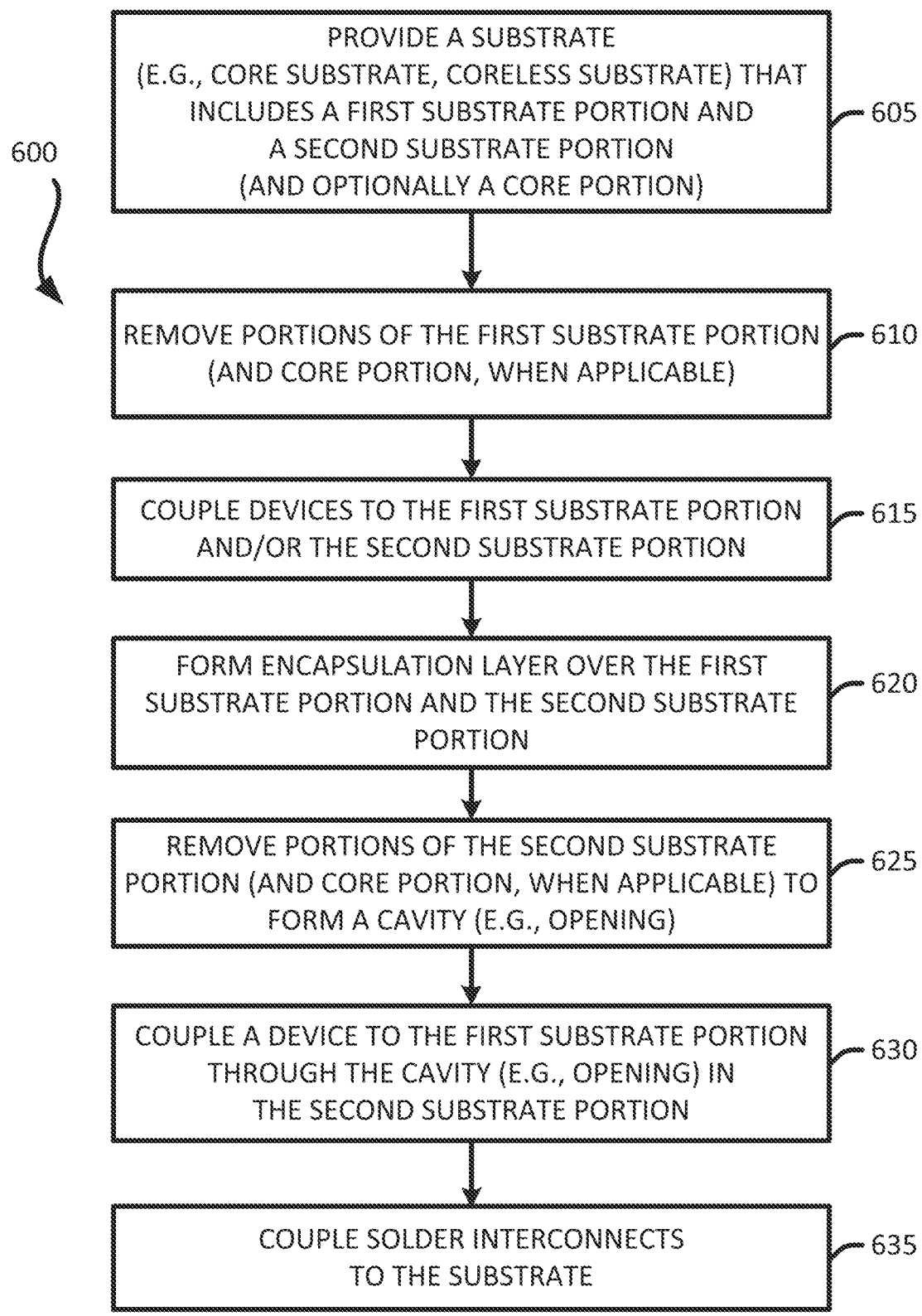
FIG. 6 illustrates an exemplary flow diagram of a method for fabricating a package that includes a step-shaped substrate.

Exemplary Flow Diagram of a Method for Fabricating a Package that Includes a Substrate Having a Step Shape In some implementations, fabricating a package with a substrate includes several processes. FIG. 6 illustrates an exemplary flow diagram of a method 600 for providing or fabricating a package that includes a substrate with a step shape. In some implementations, the method 600 of FIG. 6 may be used to provide or fabricate the package of FIG. 2. For example, the method of FIG. 6 may be used to fabricate the package 200. However, the method of FIG. 6 may be used fabricate any package in the disclosure.

It should be noted that the method of FIG. 6 may combine one or more processes in order to simplify and/or clarify the method for providing or fabricating a package. In some implementations, the order of the processes may be changed or modified.

The method provides (at 605) a substrate (e.g., 401) that includes a first substrate portion (e.g., 202, 302) and a second substrate portion (e.g., 204, 304). The substrate may also include a core portion (e.g., 201). The core portion may include a core layer (e.g., 220) and a plurality of core interconnects 221. The core layer 220 may include glass, quartz, and reinforced fiber. However, the core layer 220 may include different materials. The first substrate portion and the second substrate portion may include dielectric layer(s) and interconnects. FIGS. 4A-4G illustrate and describe an example of fabricating a substrate.

The method removes (at 610) portions of the first substrate portion (e.g., 204, 304) and if applicable, portions of the core portion 202. Different implementations may remove the portions differently. A sand blasting and/or an etching process may be used to remove portions of the core portion 202 and portions of the first substrate portion (e.g., 204, 304). For example, a sand blasting process may be used to remove portions of the first substrate portion (e.g., 204, 304) and an etching process and/or laser process (e.g., laser ablation) may be used to remove portions of the core portion 202. Removing portions of the first substrate portion (e.g., 204, 304) may include removing some of the at least one first dielectric layer 224. Removing portions of the core portion 202 may include removing some of the core layer 220. Stage 2 of FIG. 5A illustrates and describes an example of removing portions of the first substrate portion and the core portion.

The method couples (at 615) a plurality of devices to the first substrate portion and the second substrate portion. Coupling the plurality of devices includes coupling integrated devices (e.g., 205, 207) and/or passive devices (e.g., 209) to the first substrate portion (e.g., 204, 304) and the second substrate portion (e.g., 206, 306). A pick and place process with a reflow solder process may be used to place and couple the various integrated devices and passive devices. For example, the integrated device 205 and the passive device 209c are coupled to the first surface of the second substrate portion (e.g., 206, 306), and the integrated device 207 and the passive devices 209a and 209b are coupled to the first surface of the first substrate portion (e.g., 204, 304). Stage 3 of FIG. 5A illustrates and describes an example of coupling devices to the substrate portions.

The method forms (at 620) an encapsulation layer (e.g., 208) over the substrate portions. For example, the encapsulation layer 208 may be formed over the first substrate portion (e.g., 204, 304) and the second substrate portion (e.g., 206, 306). The encapsulation layer 208 may encapsulate the integrated device 205, the integrated device 207 and the plurality of passive devices 290a-290c. A compression and transfer molding process, a sheet molding process, or a liquid molding process may be used to form the encapsulation layer 208. Stage 4 of FIG. 5B, illustrates and describes an example of forming an encapsulation layer over substrate portions.

The method removes (at 625) portions of the second substrate portion, and if applicable, portions of the core portion. Different implementations may remove the portions differently. A sand blasting and/or an etching process may be used to remove portions of the core portion 202 and portions of the second substrate portion (e.g., 206, 306). For example, a sand blasting process may be used to remove portions of the second substrate portion (e.g., 206, 306), and an etching process and/or a laser process (e.g., laser ablation) may be used to removed portions of the core portion 202. Removing portions of the second substrate portion (e.g., 206, 306) may include removing some of the at least one second dielectric layer 226. Removing portions of the core portion 202 may include removing some of the core layer 220. Removing portions of the second substrate portion (e.g., 206, 306) and portions of the core portion 202 may form a cavity 260 (e.g., opening) in the second substrate portion (e.g., 206, 306) and the core portion 202. Removing portions of the core portion 202, the first substrate portion (e.g., 204, 304) and the second substrate portion (e.g., 206, 306) may form a substrate with a step shape and/or a side profile U shape. Stage 5 of FIG. 5B illustrates and describes an example of removing portions of the second substrate portion and the core portion.

The method couples (at 630) a device to the first substrate portion through a cavity (e.g., opening) in the second substrate portion (and if applicable, the core portion). For example, the integrated device 203 may be coupled to the first substrate portion (e.g., 204, 304) through the cavity 260 of the second substrate portion (e.g., 206, 306) and the core portion 202. A pick and place process with a reflow solder process may be used to couple the integrated device 203 to the first substrate portion (e.g., 204, 304) through the plurality of solder interconnects 230. The front side of the integrated device 203 may face the first substrate portion (e.g., 204, 304). Stage 6 of FIG. 5C illustrates and describes an example of an integrated device coupled to a first substrate portion through a cavity (e.g., opening).

The method couples (at 635) a plurality of solder interconnects (e.g., 212) to the substrate. For example, a plurality of solder interconnects 212 may be coupled to the second substrate portion 206. A reflow solder process may be used to couple the plurality of solder interconnects 212 to the second substrate portion 206. Stage 7 of FIG. 5C illustrates and describes an example of solder interconnects coupled to a substrate.

Stage 8, as shown in FIG. 5D, illustrates a state after the package 200 has been coupled to the board 210 through the plurality of solder interconnects 212. As mentioned above, the package 200 includes a core substrate that has a step shape. However, in some implementations, a package (e.g., 300) may be implemented with a coreless substrate that has a step shape and/or side profile U shape.

Exemplary Electronic Devices

Figure 7:
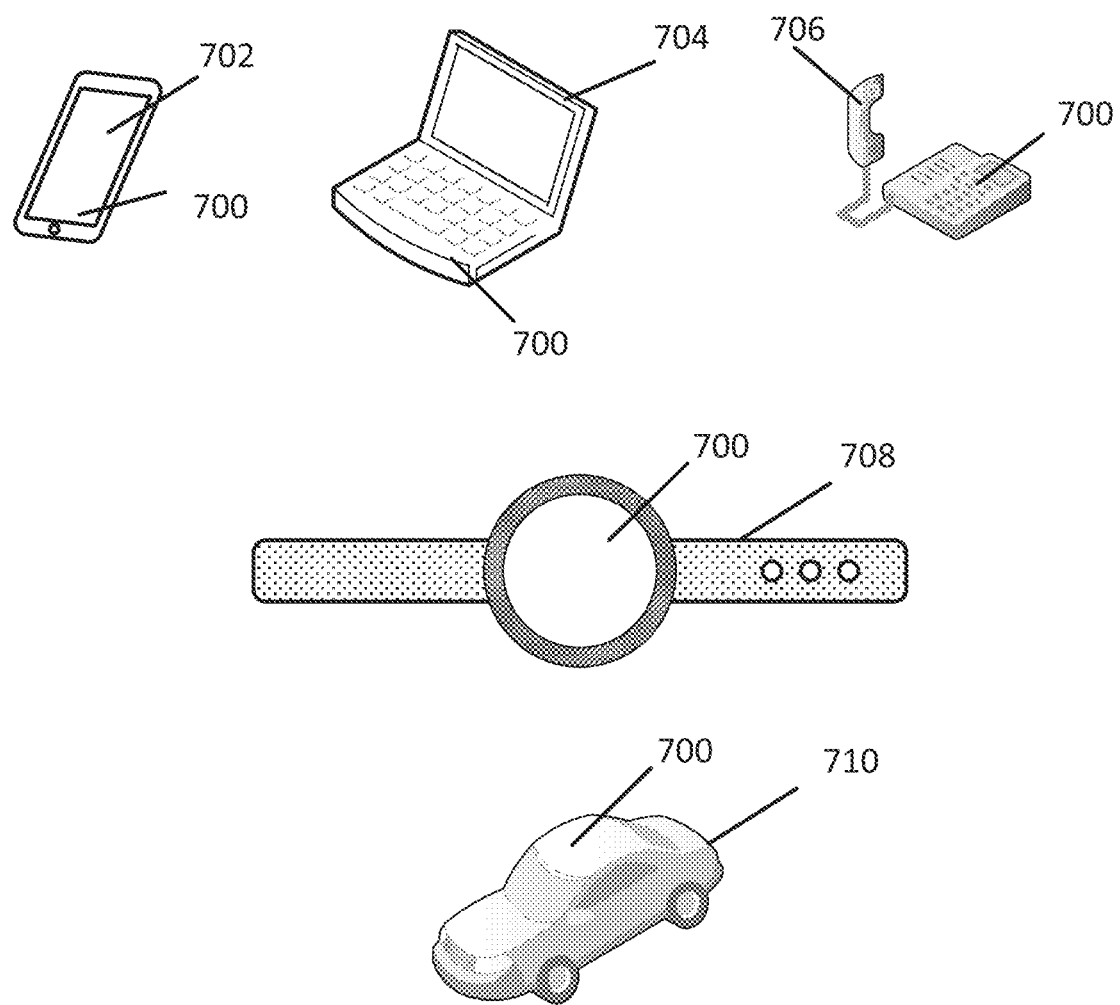
FIG. 7 illustrates various electronic devices that may integrate a die, an electronic circuit, an integrated device, an integrated passive device (IPD), a passive component, a package, and/or a device package described herein.

FIG. 7 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 702, a laptop computer device 704, a fixed location terminal device 706, a wearable device 708, or automotive vehicle 710 may include a device 700 as described herein. The device 700 may be, for example, any of the devices and/or integrated circuit (IC) packages described herein. The devices 702, 704, 706 and 708 and the vehicle 710 illustrated in FIG. 7 are merely exemplary. Other electronic devices may also feature the device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-3, 4A-4G, 5A-5D and/or 6-7 may be rearranged and/or combined into a single component, process, feature or function or embodied in several components, processes, or functions. Additional elements, components, processes, and/or functions may also be added without departing from the disclosure. It should also be noted FIGS. 2-3, 4A-4G, 5A-5D and/or 6-7 and its corresponding description in the present disclosure is not limited to dies and/or ICs. In some implementations, FIGS. 2-3, 4A-4G, 5A-5D and/or 6-7 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a substrate comprising:
   (i) a core portion comprising a first surface and a second surface, the core portion further comprising:
      a core layer; and
      a plurality of core interconnects located in the core layer;
   (ii) a first substrate portion coupled to the first surface of the core portion, the first substrate portion comprising:
      at least one first dielectric layer coupled to the core layer; and a first plurality of interconnects located in the at least one first dielectric layer, wherein the first plurality of interconnects is coupled to the plurality of core interconnects; and (iii) a second substrate portion coupled to the second surface of the core portion, the second substrate portion comprising:
at least one second dielectric layer coupled to the core layer; and
a second plurality of interconnects located in the at least one second dielectric layer, wherein the second plurality of interconnects is coupled to the plurality of core interconnects,
wherein the core portion and the second substrate portion include a cavity;
an integrated device coupled to the first substrate portion through the cavity of the second substrate portion and the core portion;
a second integrated device coupled to the first substrate portion;
a passive device coupled to at least the first substrate portion or the second substrate portion; and
an encapsulation layer located over the first substrate portion and the second substrate portion, wherein the encapsulation layer encapsulates the second integrated device and the passive device.

2. The package of claim 1, wherein the core layer includes glass, quartz, and/or reinforced fiber.

3. The package of claim 1, wherein a coupling between the first plurality of interconnects and the plurality of core interconnects is free of a solder interconnect.

4. The package of claim 3, wherein a coupling between the second plurality of interconnects and the plurality of core interconnects is free of a solder interconnect.

5. The package of claim 1, wherein the integrated device is coupled to a region of the first substrate portion that does not vertically overlap with the core portion and the second substrate portion.

6. The package of claim 1, wherein the first substrate portion, the second substrate portion and the core portion collectively comprise a side profile U shape.

7. The package of claim 1, wherein the first substrate portion, the second substrate portion and the core portion collectively comprise a step shape.

8. The package of claim 1, wherein a portion of the first substrate portion does not vertically overlap with another portion of the second substrate portion.

9. The package of claim 1, further comprising
a third integrated device coupled to the second substrate portion.

10. The package of claim 1,
wherein the core portion has a length that is approximately the same as a length of the first substrate portion,
wherein the length of the core portion includes a length of the cavity in the core portion,
wherein the core portion has a length that is less than a length of the second substrate portion, and
wherein the length of the second substrate portion include a length of the cavity in the second substrate portion.

11. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

12. A package comprising:
a substrate comprising:
(i) a core portion comprising a first surface and a second surface, the core portion further comprising:
a core layer; and
a plurality of core interconnects located in the core layer;
(ii) a first substrate portion coupled to the first surface of the core portion, the first substrate portion comprising:
at least one first dielectric layer coupled to the core layer; and
a first plurality of interconnects located in the at least one first dielectric layer, wherein the first plurality of interconnects is coupled to the plurality of core interconnects; and
(iii) a second substrate portion coupled to the second surface of the core portion, the second substrate portion comprising:
at least one second dielectric layer coupled to the core layer; and
a second plurality of interconnects located in the at least one second dielectric layer, wherein the second plurality of interconnects is coupled to the plurality of core interconnects,
wherein the core portion and the second substrate portion include a cavity;
an integrated device coupled to the first substrate portion through the cavity of the second substrate portion and the core portion;
a second integrated device coupled to the second substrate portion;
a passive device coupled to at least the second substrate portion or the first substrate portion; and
an encapsulation layer located over the first substrate portion and the second substrate portion, wherein the encapsulation layer encapsulates the another second integrated device and the passive device.

13. A package comprising:
a substrate comprising:
(i) a first substrate portion comprising:
at least one first dielectric layer; and
a first plurality of interconnects located in the at least one first dielectric layer; and
(ii) a second substrate portion coupled to the first substrate portion, the second substrate portion comprising:
at least one second dielectric layer;
a second plurality of interconnects located in the at least one second dielectric layer, wherein the second plurality of interconnects is coupled to the first plurality of interconnects; and
a cavity that extends through the at least one second dielectric layer,
wherein the first substrate portion has a length that is less than a length of the second substrate portion,
wherein the length of the second substrate portion includes a length of the cavity in the second substrate portion,
an integrated device coupled to the first substrate portion through the cavity of the second substrate portion;
a second integrated device coupled to the first substrate portion;

a passive device coupled to at least the first substrate portion or the second substrate portion; and an encapsulation layer located over the first substrate portion and the second substrate portion, wherein the encapsulation layer encapsulates the second integrated device and the passive device.

14. The package of claim 13, further comprising a third integrated device coupled to the second substrate portion, wherein the third integrated device is located at least partially laterally to the integrated device.

15. The package of claim 14,
wherein a front side of the integrated device faces the first substrate portion, and
wherein a front side of the third integrated device faces the second substrate portion.

16. The package of claim 13, further comprising
a third integrated device coupled to the second substrate portion.

17. The package of claim 13, wherein the substrate is a coreless substrate.

18. The package of claim 13, further comprising a third integrated device coupled to the first surface of the first substrate portion, wherein the integrated device is coupled to the second surface of the first substrate portion.

19. A package comprising:
a substrate comprising:
(i) a first substrate portion comprising:
at least one first dielectric layer; and
a first plurality of interconnects located in the at least one first dielectric layer; and
(ii) a second substrate portion coupled to the first substrate portion, the second substrate portion comprising:
at least one second dielectric layer;
a second plurality of interconnects located in the at least one second dielectric layer, wherein the second plurality of interconnects is coupled to the first plurality of interconnects; and
a cavity that extends through the at least one second dielectric layer,
wherein the first substrate portion has a length that is less than a length of the second substrate portion,
wherein the length of the second substrate portion includes a length of the cavity in the second substrate portion,
an integrated device coupled to the first substrate portion through the cavity of the second substrate portion;
a second integrated device coupled to the second substrate portion;
a passive device coupled to at least the second substrate portion or the first substrate portion; and
an encapsulation layer located over the first substrate portion and the second substrate portion, wherein the encapsulation layer encapsulates the second integrated device and the passive device.

20. The package of claim 19, wherein the second integrated device is located laterally to the first substrate portion.

21. A method for fabricating a package, comprising:
providing a substrate comprising:
(i) a core portion comprising a first surface and a second surface, the core portion further comprising:
a core layer; and
a plurality of core interconnects located in the core layer;
(ii) a first substrate portion coupled to the first surface of the core portion, the first substrate portion comprising:
at least one first dielectric layer coupled to the core layer; and
a first plurality of interconnects located in the at least one first dielectric layer, wherein the first plurality of interconnects is coupled to the plurality of core interconnects; and
(iii) a second substrate portion coupled to the second surface of the core portion, the second substrate portion comprising:
at least one second dielectric layer coupled to the core layer; and
a second plurality of interconnects located in the at least one second dielectric layer, wherein the second plurality of interconnects is coupled to the plurality of core interconnects,
coupling a first device to a first surface of the first substrate portion;
coupling a second device to a first surface of the second substrate portion;
forming a cavity in the second substrate portion and the core portion; and
coupling an integrated device to the first substrate portion through the cavity of the second substrate portion and the core portion.

22. The method of claim 21, further comprising forming an encapsulation over the first surface of the first substrate portion and the first surface of the second substrate portion.

23. The method of claim 21, wherein a front side of the integrated device is coupled to a second surface of the first substrate portion.

24. The method of claim 21, wherein the integrated device is located at least partially in the cavity of the second substrate portion and the core portion.

25. The method of claim 21,
wherein the first device includes a first integrated device or a first passive device, and
wherein the second device includes a second integrated device or a second passive device.

26. A method for fabricating a package, comprising:
providing a substrate comprising:
(i) a first substrate portion comprising:
at least one first dielectric layer; and
a first plurality of interconnects located in the at least one first dielectric layer; and
(ii) a second substrate portion coupled to the first substrate portion, the second substrate portion comprising:
at least one second dielectric layer;
a second plurality of interconnects located in the at least one second dielectric layer, wherein the second plurality of interconnects is coupled to the first plurality of interconnects, and
wherein the first substrate portion has a length that is less than a length of the second substrate portion,
coupling a first device to a first surface of the first substrate portion;
coupling a second device to a first surface of the second substrate portion;
forming a cavity in the second substrate portion,
wherein the cavity extends through the at least one second dielectric layer, and
wherein the length of the second substrate portion includes a length of the cavity in the second substrate portion,
wherein the cavity is formed in the second substrate such that the first device and the second device are located outside of the cavity, and coupling an integrated device to the first substrate portion through the cavity of the second substrate portion.

27. The method of claim 26, further comprising forming an encapsulation over the first surface of the first substrate portion and the first surface of the second substrate portion.

28. The method of claim 26, wherein a front side of the integrated device is coupled to a second surface of the first substrate portion.

29. The method of claim 26, wherein the integrated device is located at least partially in the cavity of the second substrate portion.

30. The method of claim 26, wherein the first substrate portion and the second substrate portion collectively comprise a side profile U shape.

\* \* \* \* \*